United States Patent
Teig et al.

(10) Patent No.: US 7,051,293 B1
(45) Date of Patent: *May 23, 2006

(54) METHOD AND APPARATUS FOR CREATING AN EXTRACTION MODEL

(75) Inventors: Steven Teig, Menlo Park, CA (US); Arindam Chatterjee, San Carlos, CA (US)

(73) Assignee: Cadence Design Systems, Inc., San Jose, CA (US)

(*) Notice: Subject to any disclaimer, the term of this patent is extended or adjusted under 35 U.S.C. 154(b) by 797 days.

This patent is subject to a terminal disclaimer.

(21) Appl. No.: 10/061,945

(22) Filed: Jan. 31, 2002

Related U.S. Application Data

(60) Provisional application No. 60/315,867, filed on Aug. 28, 2001, provisional application No. 60/315,834, filed on Aug. 28, 2001.

(51) Int. Cl.
*G06F 17/50* (2006.01)

(52) U.S. Cl. .................................. 716/1; 716/2; 716/7

(58) Field of Classification Search ................ 716/5–7, 716/1, 2, 18
See application file for complete search history.

(56) References Cited

U.S. PATENT DOCUMENTS

| | | | |
|---|---|---|---|
| 4,300,196 A | 11/1981 | Lopresti | |
| 4,839,823 A | 6/1989 | Matsumoto | |
| 5,276,632 A | 1/1994 | Corwin et al. | |
| 5,452,224 A | 9/1995 | Smith et al. | |
| 5,642,296 A | 6/1997 | Saxena | |
| 5,689,621 A | 11/1997 | Salam et al. | |
| 5,808,919 A | 9/1998 | Preist et al. | |
| 5,822,218 A | 10/1998 | Moosa et al. | |
| 5,901,063 A | 5/1999 | Chang et al. | |
| 5,903,469 A | 5/1999 | Ho | |
| 6,018,623 A | 1/2000 | Chang et al. | |
| 6,038,338 A | 3/2000 | Nguyen | |
| 6,038,383 A | 3/2000 | Young et al. | |

(Continued)

OTHER PUBLICATIONS

U.S. Appl. No. 10/335,247, filed Dec. 31, 2002, Steven Teig et al.

(Continued)

*Primary Examiner*—Stacy A. Whitmore
(74) *Attorney, Agent, or Firm*—Stattler Johansen & Adeli LLP

(57) ABSTRACT

A system for using machine-learning to create a model for performing integrated circuit layout extraction is disclosed. The system of the present invention has two main phases: model creation and model application. The model creation phase comprises creating one or more extraction models using machine-learning techniques. First, a complex extraction problem is decomposed into smaller simpler extraction problems. Then, each smaller extraction problem is then analyzed to identify a set of physical parameters that fully define the smaller extraction problem. Next, models are created using machine learning techniques for all of the smaller simpler extraction problems. The machine learning is performed by first creating training data sets composed of the identified parameters from typical examples of the smaller extraction problem and the answers to those example extraction problems as solved using a highly accurate physics-based field solver. The training sets are then used to train the models. In one embodiment, neural networks are used to model the extraction problems. To train the neural network models. Bayesian inference is used in one embodiment. Bayesian inference may be implemented with normal Monte Carlo techniques or Hybrid Monte Carlo techniques. After the creation of a set of models for each of the smaller simpler extraction problems, the machine-learning based models may be used for extraction.

10 Claims, 29 Drawing Sheets

U.S. PATENT DOCUMENTS

| | | | |
|---|---|---|---|
| 6,061,508 | A | 5/2000 | Mehrotra et al. |
| 6,128,768 | A | 10/2000 | Ho |
| 6,182,269 | B1 | 1/2001 | Laubhan |
| 6,189,131 | B1 | 2/2001 | Graef et al. |
| 6,209,123 | B1 | 3/2001 | Maziasz et al. |
| 6,212,492 | B1 | 4/2001 | Kuge |
| 6,243,653 | B1 | 6/2001 | Findley |
| 6,304,836 | B1 | 10/2001 | Krivokapic et al. |
| 6,304,837 | B1 | 10/2001 | Geiger et al. |
| 6,327,556 | B1 | 12/2001 | Geiger et al. |
| 6,381,555 | B1 | 4/2002 | Sewell |
| 6,414,498 | B1 | 7/2002 | Chen |
| 6,430,729 | B1 | 8/2002 | Dewey et al. |
| 6,446,027 | B1 | 9/2002 | O Keefe et al. |
| 6,526,549 | B1 | 2/2003 | You |
| 6,543,035 | B1 | 4/2003 | Ohba et al. |
| 6,549,854 | B1 | 4/2003 | Malinverno et al. |
| 6,581,195 | B1 | 6/2003 | Tanaka |
| 6,581,198 | B1 | 6/2003 | Teig et al. |
| 6,584,456 | B1 | 6/2003 | Dom et al. |
| 6,587,997 | B1 | 7/2003 | Chen et al. |
| 6,687,887 | B1 | 2/2004 | Teig et al. |
| 6,735,748 | B1 | 5/2004 | Teig et al. |
| 6,883,148 | B1 * | 4/2005 | Teig et al. .................. 716/4 |
| 6,907,591 | B1 * | 6/2005 | Teig et al. .................. 716/7 |
| 2002/0010691 | A1 | 1/2002 | Chen |
| 2002/0056070 | A1 | 5/2002 | Tanaka |
| 2002/0075383 | A1 | 6/2002 | Trobaugh et al. |
| 2003/0065535 | A1 | 4/2003 | Karlov et al. |
| 2003/0236760 | A1 | 12/2003 | Nugent |
| 2004/0049751 | A1 | 3/2004 | Teig et al. |

OTHER PUBLICATIONS

U.S. Appl. No. 10/335,097, filed Dec. 31, 2002, Steven Teig et al.

U.S. Appl. No. 10/335,248, filed Dec. 31, 2002, Steven Teig et al.

U.S. Appl. No. 10/335,095, filed Dec. 31, 2002, Steven Teig et al.

U.S. Appl. No. 10/334,664, filed Dec. 31, 2002, Steven Teig et al.

U.S. Appl. No. 10/062,264, filed Jan. 31, 2002, Steven Teig et al.

U.S. Appl. No. 10/062,184, filed Jan. 31, 2002, Steven Teig et al.

U.S. Appl. No. 10/066,326, filed Jan. 31, 2002, Steven Teig et al.

U.S. Appl. No. 10/062,193, filed Jan. 31, 2002, Steven Teig et al.

U.S. Appl. No. 10/062,196, filed Jan. 31, 2002, Steven Teig et al.

Brambilla, A. et al., Statistical Method for the Analysis of Interconnects Delay in Submicrometer Layouts, IEEE, Aug. 2001, pp. 957-966.

Brandt et al., Circuit Multi-fault Diagnosis and Prediction Error Estimation Using a Committee of Bayesian Neutral Networks, IEEE, Colloquium on Testing Mixed Signal Circuits and Systems, Oct. 23, 1997, pp. 7/1-7/7.

Fertig, "Extracting Knowledge from Case Databases", Apr. 1991, IEEE Proceedings on Seventeenth Annual Northeast Bioengineering Conference, pp. 267-268.

Hung et al., Machine Learning in Engineering Design—an Unsupervised Fuzzy Neural Network Case-based Learning Model, Dec. 1997, IEEE Proceeding, Intelligent Information System, pp. 156-160.

Hunter, Knowledge Acquisition Planning for Inference from Large Databases, Jan. 1990, IEEE Proceeding of the 23th Annual Hawaii International Conference on System Sciences, vol. 2, pp. 35-44.

Ida et al., Bayesian Analysis in Manufacturing Instrumentation for Test and Evaluation, IEEE, Conference record of 1993 Fourth Fifth Annual Conference of Electrical Engineering Problems and Plastics Industries, Apr. 27, 1993, pp. 4-13.

Kolehmainen et al., A Bayesian Approach and Total Variation Priors in 3D Electrical Impedance Tomography, Proceedings of the 20th Annual International Conference of the IEEE Engineering in Medicine and Biology Society, vol. 2, Oct. 29, 1998, pp. 1028-1031.

Li et al., Monte Carlo Simulation Techniques for Probabilistic Tracking, IEEE, 2001, pp. 75-82.

Li et al., Pre-extracting Support Vectors for Support Vector Machine, Aug. 2000, IEEE Proceedings of 5th International Conference on Signal Processing, vol. 3, pp. 1432-1435.

Mani, N., A Neural Network Model for Partitioning in Floorplan Design, IEEE, pp. 1676-1680.

Niu et al., A Bayesian Approach to Variable screening for Modeling the IC Fabrication Process, 1995, IEEE International Symposium on Circuits and Systems, vol. 2, Apr. 30, 1995, pp. 1227-1230.

NN9107436, Maximum Likelihood Training of Probabilistic Linear Functions (Probabilistic Perceptrons), IBM Technical Disclosure Bulletin, vol. 34, No. 2, Jul. 1991. pp. 436-442.

Ruping, S., Incremental Learning with Support Vector Machines, Dec. 2001, IEEE Proceedings of Internal Conference on Data Mining, pp. 641-642.

Suykens, Nonlinear Modelling and Support Vector Machines, May 2001, IEEE Proceedings of the $18^{th}$ Instrumentation and Measurement Technology Conference, vol. 1, pp. 287-294.

Vehtari et al., Bayesian Neural networks for Industrial Applications, Proceedings of the 1999 IEEE Midnight-Sun Workshop on Soft Computing Methods in Industrial Applications, Jun. 16, 1999, pp. 63-68.

Wang et al., Accurate Parasitic Resistance Extraction for Interconnection Analysis, 1995, IEEE, Custom integrated circuits conference, 255-258.

Wright, W.A., Bayesian Approach to Neutral Network Modeling with Input Uncertainty, IEEE, Nov. 1999, pp. 1261-1270.

Yerramareddy et al., Creating and Using Models for Engineering Design A Machine-Learning Approach, Jun. 1992, IEEE Intelligent Systems, vol. 7, iss. 3, pp. 52-59.

Zhang et al., Confidence Regions for Cascaded Neural Network Prediction in Power Markets, 2001 Power Engineering Society Winter Meeting, vol. 2, Jan. 28, 2001, pp. 533-538.

Zhang, C.X. et al., Floorplan Design Using a Hierarchical Neutral Learning Algorithm, IEEE, Jun. 1991. pp. 2060-2063.

* cited by examiner

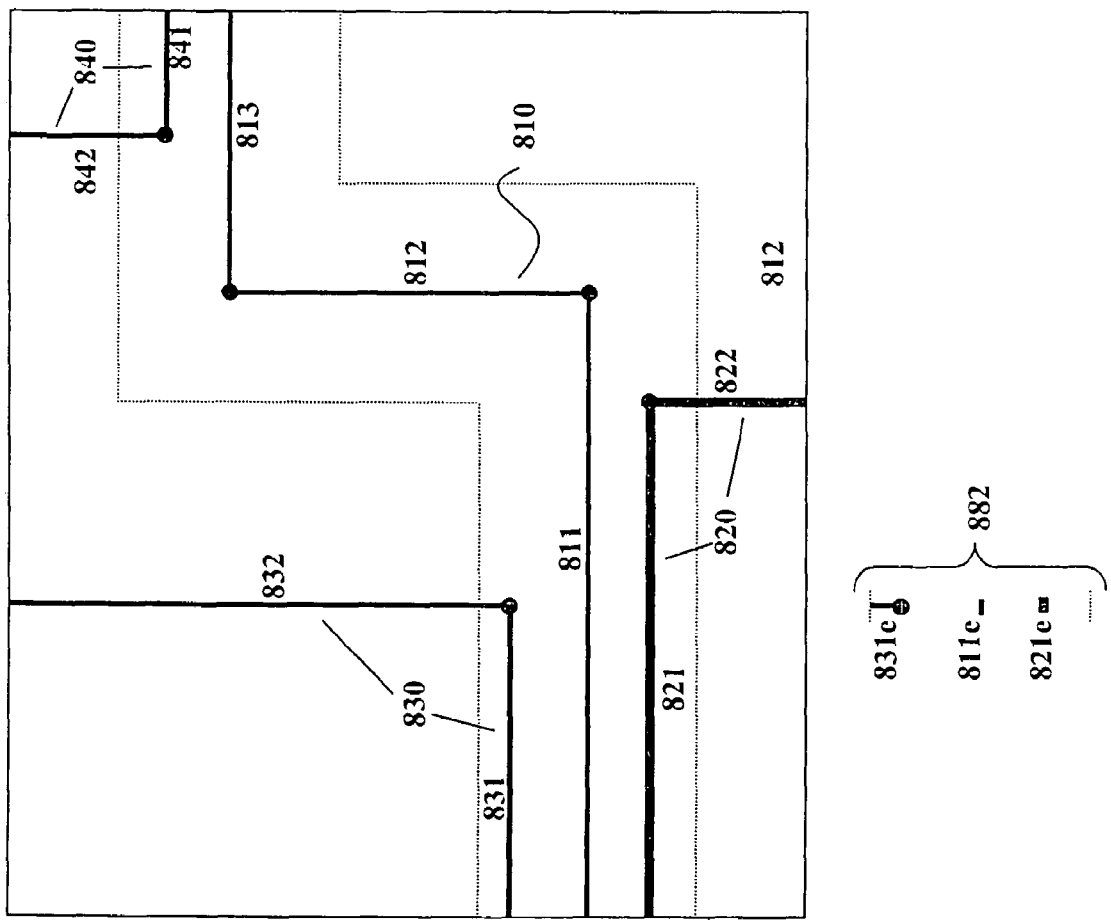

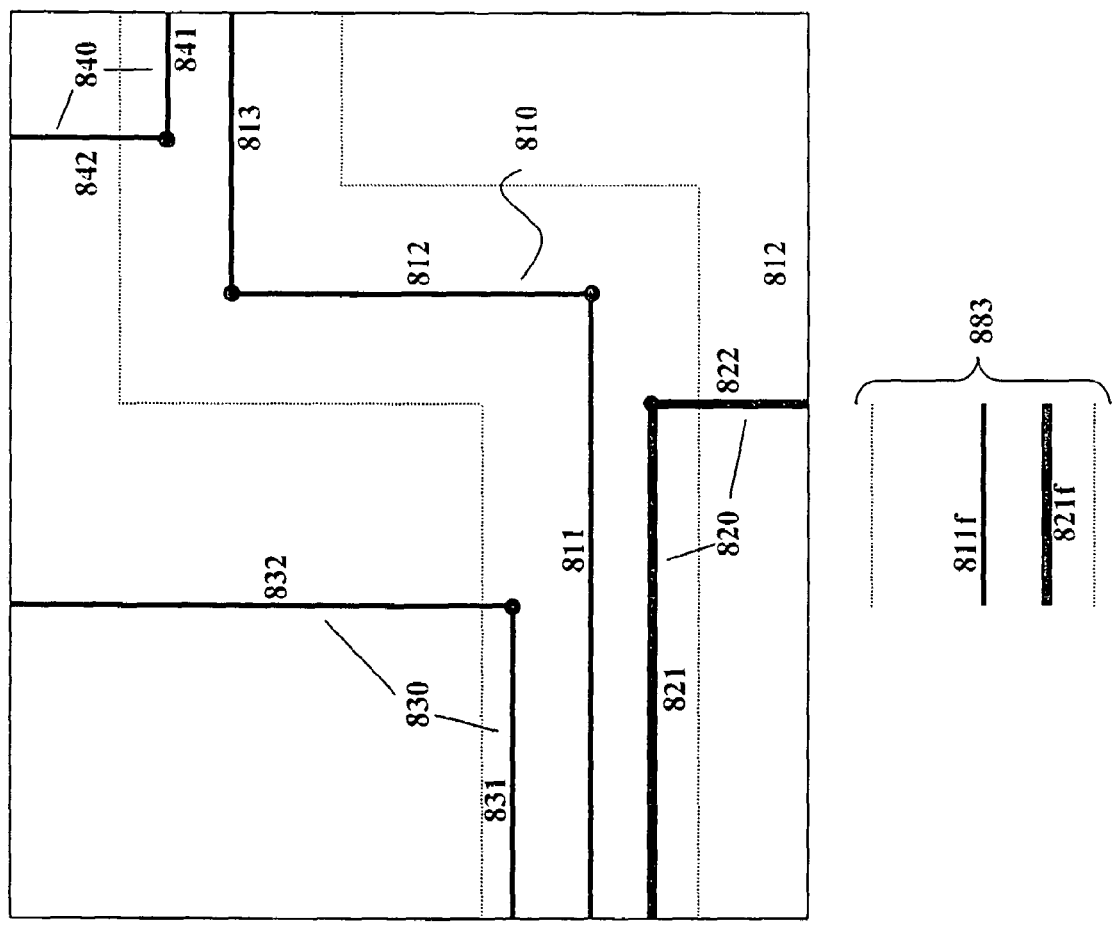

METHOD AND APPARATUS FOR CREATING AN EXTRACTION MODEL

This application claims benefit of applications 60/315,867 and 60/315,834 both filed Aug. 28, 2001.

FIELD OF THE INVENTION

The present invention relates to the field of semiconductor design, semiconductor design testing, and semiconductor manufacture. In particular the present invention discloses methods for estimating various electrical and physical properties of semiconductor integrated circuit designs.

BACKGROUND OF THE INVENTION

Complex digital integrated circuits ("ICs") are initially designed using high-level logic elements such as adders, arithmetic/logic units (ALUs), memory units, buses, etc. These high level elements are in turn constructed from lower level components such as AND gates, OR gates, inverters, etc. These lower level components are constructed from basic electronic components such as transistors, diodes, and electrical conductive traces. All of these electronic and circuit components of ICs are jointly referred to as "components."

Design engineers design an integrated circuit by transforming a circuit description of the integrated circuit into geometric descriptions of physical components that create the basic electronic components. The detailed geometric descriptions of physical components are referred to as integrated circuit layouts.

To create the integrated circuit layout for a complex integrated circuit, circuit design engineers use Electronic Design Automation ("EDA") application programs. These EDA application programs are computer-based tools for creating, editing, and analyzing integrated circuit design layouts.

It is a layout EDA application program that creates a physical integrated circuit design layout from a logical circuit design. The layout EDA application uses geometric shapes of different materials to create the various electrical components on an integrated circuit. For instance, EDA tools commonly use rectangular lines to represent the passive wire segments (conductors) that interconnect the active integrated circuit components such as transistors. These EDA tools also represent electronic and circuit IC components as geometric objects with varying shapes and sizes.

After an initial integrated circuit layout has been created, the integrated circuit layout is tested and optimized using a set of EDA testing tools. Common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" electrical characteristics of the integrated circuit layout. The step of verification uses the extracted electrical characteristics to analyze the circuit design using circuit analysis tools.

Common electrical characteristics that are extracted from an integrated circuit layout include capacitance and resistance of the various "nets" (electrical interconnects) in the integrated circuit. These electrical characteristics are sometimes referred to as "parasitic" since these are electrical characteristics are not intended by the designer but result from the underlying physics of the integrated circuit design.

For example, when an electrical circuit designer wishes to connect two different locations of an integrated circuit with an electrical conductor, the electrical circuit designer would ideally like perfect conductor with zero resistance and zero capacitance. However, the geometry of a real conductor, its material composition, and its interaction with other nearby circuit elements will create some parasitic resistance and parasitic capacitance. The parasitic resistance and parasitic capacitance affect the operation of the designed integrated circuit. Thus, the effect of the parasitic resistance and parasitic capacitance affect must be considered.

To test an integrated circuit layout, the parasitic resistance and parasitic capacitance are "extracted" from the integrated circuit layout and then the integrated circuit is analyzed and possibly simulated with a using the extracted parasitic resistance and parasitic capacitance. If the parasitic resistance or parasitic capacitance cause undesired operation, then the integrated circuit layout must be changed. Furthermore, minimizing the amount of parasitic resistance and parasitic capacitance can optimize the performance of the integrated circuit.

Extracting the electrical characteristics of the integrated circuit layout (such as capacitance, resistance, and inductance) is an extremely difficult task. Most existing extraction systems approximate sections of an integrated circuit with similar geometric configurations having known electrical characteristics. Interpolation between various different similar geometric configurations is used to further refine extracted electrical characteristics.

The existing extraction techniques have been adequate but are increasingly becoming problematic as the feature size of the electrical components on integrated circuits grow ever smaller. With the very small feature size of current and upcoming semiconductor processes, the accurate extraction of electrical characteristics from integrated circuit layouts becomes critical. Thus, it would be desirable to implement new integrated circuit extraction methods that are both accurate and fast.

SUMMARY OF THE INVENTION

The present invention introduces a novel method of performing integrated circuit layout extraction using machine-learning. The system of the present invention has two main phases: model creation and model application.

The model creation phase comprises creating one or more extraction models using machine-learning techniques. First, a complex extraction problem is decomposed into smaller simpler extraction problems. Each smaller extraction problem is then analyzed to identify a set of parameters that fully define the smaller extraction problem. Then, models are created using machine learning techniques for all of the smaller simpler extraction problems.

The machine learning is performed by first creating training data sets composed of the identified parameters from typical examples of the smaller extraction problem and the answers to those example extraction problems as solved using a highly accurate physics based field solver. The training sets are then used to train the models. In one embodiment, neural networks are used to model the extraction problems. To train the neural network models, Bayesian inference is used in one embodiment. Bayesian inference may be implemented with normal Monte Carlo techniques or Hybrid Monte Carlo techniques. After the creation of a set of models for each of the smaller simpler extraction problems, the machine-learning based models may be used for extraction.

To apply the machine-learning based extraction models, the extraction software first decomposes a larger extraction problem from an integrated circuit layout into the various different smaller simpler extraction problems previously identified. Then, for each smaller simpler extraction problem, the extraction software selects the parameters that define that smaller simpler extraction problem from the integrated circuit layout. The extraction software then supplies the parameters to the machine-learning based extraction model trained for such a smaller simpler extraction problem.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 8E illustrates the calculation of the capacitance for a second horizontal section of critical net 810.

FIG. 8F illustrates the calculation of the capacitance for a third horizontal section of critical net 810.

DETAILED DESCRIPTION OF THE PREFERRED EMBODIMENT

Figure 1:
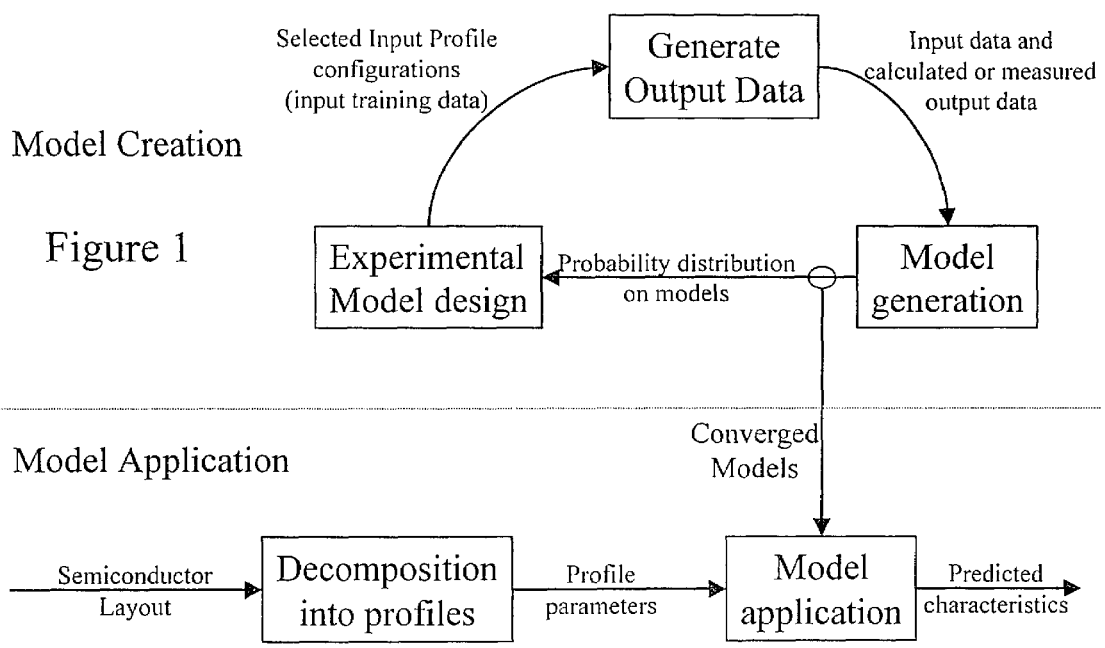
FIG. 1 illustrates a conceptual diagram that describes the overall flow of a system implemented using the present invention.

Methods for extracting electrical characteristics from integrated circuit layouts using probabilistic models are disclosed. In the following description, for purposes of explanation, specific nomenclature is set forth to provide a thorough understanding of the present invention. However, it will be apparent to one skilled in the art that these specific details are not required in order to practice the present invention. For example, the present invention has primarily been described with reference to Bayesian Networks. However, the same techniques can easily be applied to other types of function model creation systems.

Electrical Characteristic Extraction

Various different methods are used to extract electrical characteristics from an integrated circuit layout. The various different methods have their own advantages and disadvantages.

Field Solvers

To extract a set of highly accurate electrical characteristics from an integrated circuit layout, an EDA extraction application may apply field solvers. Field solvers discretize the integrated circuit layout and accurately model the physical phenomena of the integrated circuit components using the known laws of physics and electromagnetism. The final output from a field solver is a highly accurate determination of the electrical characteristics of the various integrated circuit components Although field solvers are very accurate, is impractical to use field solvers to extract the electrical characteristics from an entire integrated circuit layout. Specifically, field solvers are very computationally intensive since millions of data points must be processed. Thus, using field solvers to extract the electrical characteristics from an entire integrated circuit layout would take an unacceptable amount of time.

Since field solvers are very accurate but painstakingly slow, field solvers are generally only used to solve small test cases or critical nets in an integrated circuit layout. Other means must be used to extract the electrical characteristics from the remainder of an integrated circuit.

Simple Formulas and Pre-Calculated Tables

Since field solvers are impractical to perform extraction on an entire integrated circuit layout, most extraction systems greatly simplify the extraction problem such that field solver is not required. First, the integrated circuit layout is divided into small pieces wherein each small piece contains a recognized primitive geometric pattern. Then, the extraction system extracts electrical characteristics from the recognized primitive geometric pattern by applying a simplified formula or using pre-calculated table for such a primitive geometric pattern.

For example, an interconnect net may be divided into simple rectangular interconnect line sections (as seen from above). Using a width of a straight interconnect line section and the height of the interconnect line (the metal layer thickness), a cross section shape and size of the straight interconnect line section can be determined. Using shape and size of the interconnect line cross-section and its material composition, a simple resistance per unit length value may be determined. Finally, a resistance value for the straight interconnect line section may be extracted by multiplying the resistance per unit length value (determined from the shape, size, and material composition of the interconnect line cross section) by the length of the interconnect line section. Thus, a simplified formula can be used to extract some electrical characteristics from an integrated circuit layout.

Similarly, pre-calculated tables may also be used to simplify and speed up the extraction of electrical characteristics from an integrated circuit layout. For example, to extract the capacitance from an interconnect net, the length of an interconnect net may first be divided into different sections wherein each section has unvarying surrounding features. Then, the known surrounding conditions for each section are used to identify an appropriate pre-calculated table that will be used to extract the capacitance. The pre-calculated tables are constructed by using a field solver for the various different surrounding condition primitives.

For example, in one section of the interconnect net, an interconnect line may pass over a ground plane. A pre-calculated table may specify the capacitance of an interconnect wire passing over a ground plane for varying distances between the interconnect line and the ground plane and for varying width of interconnect line. Thus, the capacitance of such a section may be extracted by selecting the proper table value using the distance between the interconnect line and the ground plane and the width of interconnect line. If the pre-calculated table does not contain an exact matching entry, then a value may be interpolated from the closest matching entries in the table.

Both the application of simplified formulas and pre-calculated table improve the speed of the extraction process. However, both systems achieve that increased speed by greatly sacrificing the accuracy of the extracted electrical characteristics. With the increasingly dense integrated circuits, the accuracy of extraction systems becomes very important. Specifically, as the transistors decrease in size, the transistor delay time decreases such that the effects of interconnect wire delay increases. For long interconnect wire routes, over 50% of the signal delay may be cause by interconnect wire delay. Thus, the importance of obtaining accurate electrical characteristics of integrated circuit designs has greatly increased.

Since integrated circuit process technology continues to improve and thus allows for even denser circuitry, there is an ever-increasing need for more accurate extraction systems that can fully analyze a full integrated circuit design in a reasonable amount of time. Thus, it would be highly desirable to implement a fast yet more accurate system for performing electrical characteristic extraction.

Electrical Characteristic Extraction Using Machine Learning

To improve the state of electrical characteristic extraction system technology, the present invention introduces the application of machine learning techniques to electrical characteristic extraction problem. Using machine-learning techniques, the system of the present invention automatically builds complex models of physical phenomena.

The system of the present invention begins by generating initial models using a first set of known training points. Experimental design techniques are then applied to the initial models to refine those models by selecting additional training data points that provide the most information. Feedback between the model generation and experimental design force the system of the present invention to converge toward a highly predictive model.

To create a training point, a set of physical dimension input parameters is first selected and then a field solver is used to determine an associated set of output points. For example, to generate a test point for a capacitance extraction systems, a set of interconnect line dimensions and interconnect line spacing dimensions is provided to an electromagnetic field solver. The electromagnetic field solver then outputs a set of capacitance effect values for each interconnect line near the examined interconnect line.

The set of training data is known as D. Thus, the machine learning problem can be stated as what is the best vector function $Y=F(X)$ that maps an input vector X to an output vector Y when provided with a set of known correct training data vectors $D=\{(X_i, Y_i): i=1 \text{ to } n\}$. In the context of a capacitance extraction system, an input vector X will consist of the interconnect line dimensions, interconnect line spacing dimensions, and any other relevant information needed to determine the capacitance of an arrangement. The output vector Y in a capacitance extraction system will be the various capacitance values.

FIG. 1 illustrates a conceptual diagram that describes the overall flow of a system implemented using the present invention. FIG. 1 will be described with reference to FIGS. 2 and 3 that describe the overall method of the present invention in greater detail.

Extraction Model Creation

Figure 2:
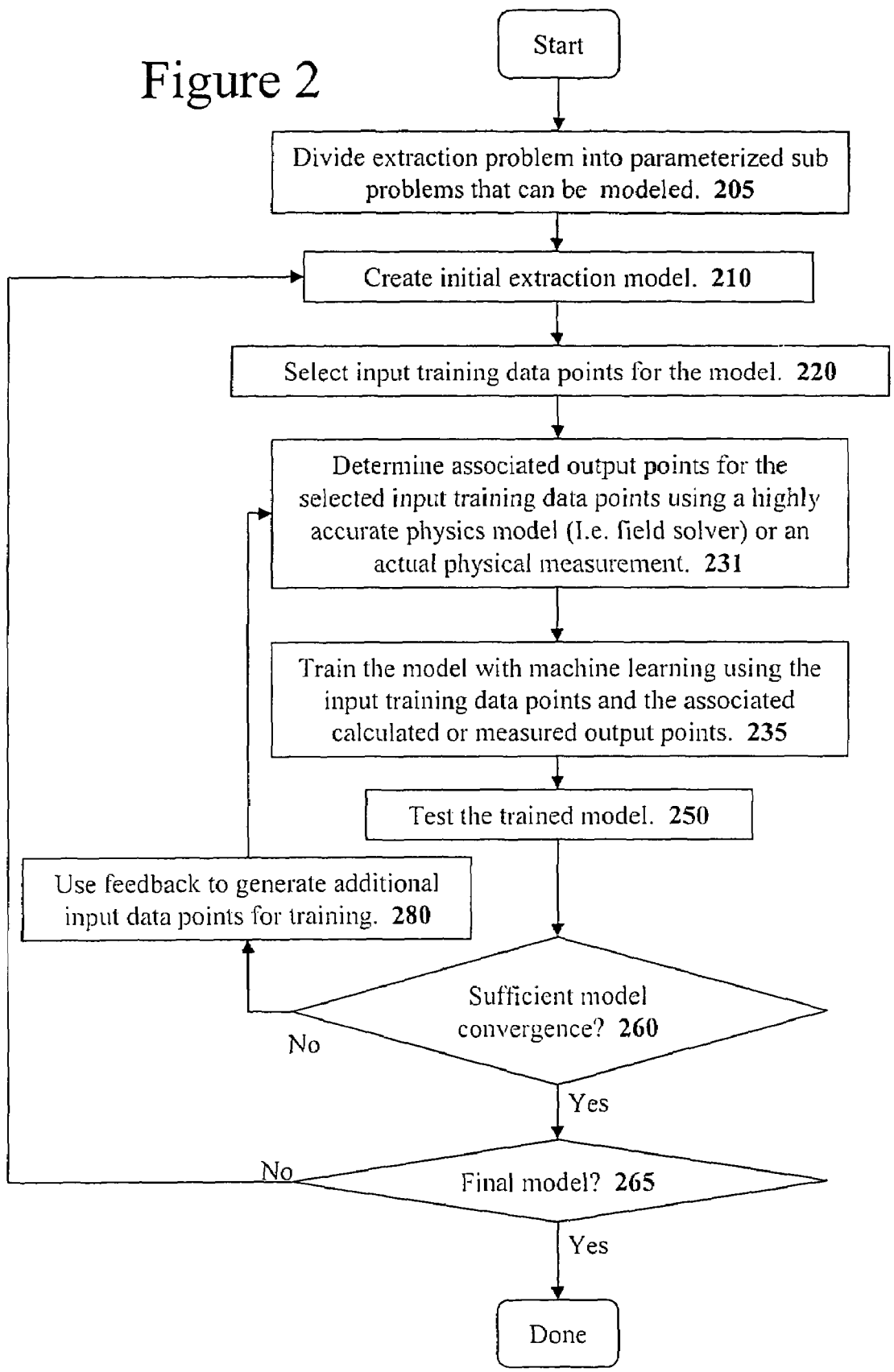
FIG. 2 illustrates a flow diagram that describes how the present invention creates a nonparametric model used for extraction.
Figure 3:
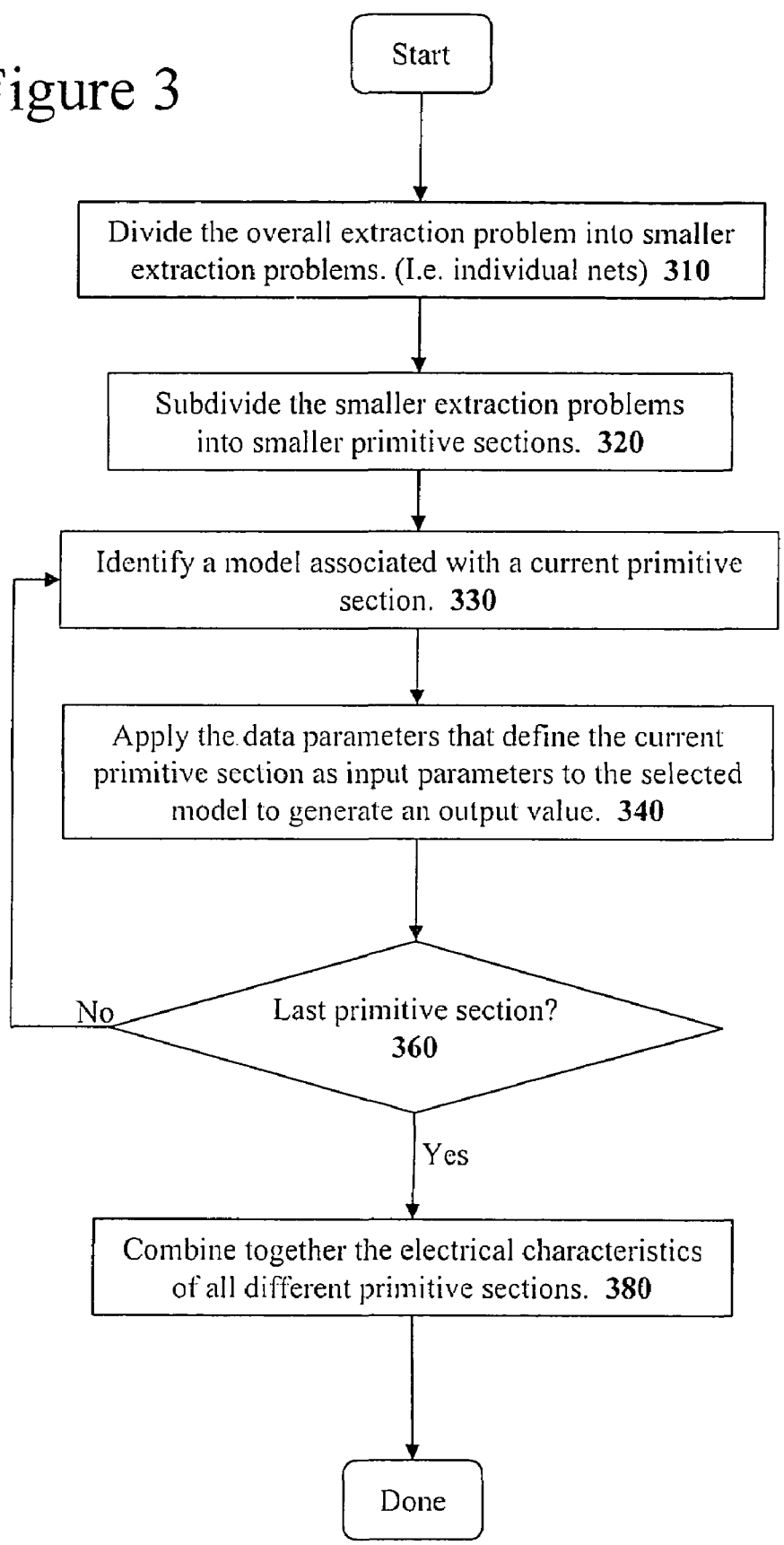
FIG. 3 illustrates a flow diagram that describes how an extraction system may use the extraction models of present invention during the extraction of electrical characteristics from a semiconductor design.

The top half of FIG. 1 describes the machine learning generation of a model function for a set of input and output training data. FIG. 2 provides a flow diagram for the model function creation using machine learning.

The system begins dividing the extraction problem into a number of smaller extraction problems that are more manageable at step 205. The smaller extraction problems must be identifiable and separable from an overall semiconductor integrated circuit design. Furthermore, there must be a reasonable method of determining the solutions for a set of examples of the smaller configuration. Manners of generating solutions for the set of examples include a highly accurate physics modeling or actual measurements from physical implementations. Extremely complex smaller extraction problems are not advisable since those complex extraction problems will be very difficult to solve.

Next, a model is created for each of the smaller extraction problems beginning with step 210. The system creates an initial extraction model design for a particular subdivided extraction problem at step 210. The subdivided smaller extraction problem should be parameterized by identifying a specific set of profile parameters completely define the subdivided extraction problem.

All parameters from a subdivided extraction problem that are constant may be dropped. For example, the physical material used for a conductor will directly affect the resistance of a conductive path. However, if the same material will be used for all implementations including a known training set and future problems to solve, then that material composition parameter may be dropped. Similarly, the vertical distance between conductors on different integrated circuit layers effects the capacitance exhibited by the conductors and would be provided to an electro-magnetic field solver that models capacitance. However, since the vertical distance between different integrated circuit layers is constant, such a vertical distance parameter may be dropped during the creation of an extraction model for the subdivided extraction problem. The initial model creation may further require the specification of model parameter such as priors that specify known information about the incoming data, as will be set forth in a later section.

Next, at step 220, a set of input data points are selected for the subdivided extraction problem. The input training data points should be selected as to best represent the type of "real world" data points that the extraction model will be likely to encounter.

Referring back to the overview diagram of FIG. 1, some system is used to generate the associated output data for the input profile configurations (the input training data). For some systems, the output data will be generated by complex physical model. For example, an electro-magnetic field-solver may be used to generate output capacitance values for specific input configurations. For some extraction problems, the output data may be generated by physically measuring selected output values from specific constructed input configurations. Specifically, referring to step 231 of FIG. 2, associated output points are generated for the input training data points using a highly accurate physics model or an actual physical measurement.

Next, at step 235, the input training data points and associated output points are used to train a model using machine learning. This is illustrated in FIG. 1 as "Model Creation". Many different machine-learning techniques may be used to perform "model creation". For example, Bayesian inference networks, Neural Networks, and Support Vector Machines (SVM) may be used to perform the machine learning. A number of techniques may be used to accelerate the often computation-intensive task of machine learning.

Referring again to FIG. 2, after creating the training the model with the selected input training data, the trained models is tested at step 250. If sufficient convergence has been achieved as tested at step 260, then the trained model may be used for extraction. If the model has not reached sufficient convergence, then feedback from the testing is used to select additional input training data points at step 280. The system then proceeds to further refine the model using the selected input data points at step 231.

Extraction Model Application

Referring back to the overview diagram of FIG. 1, once a set of extraction models has been sufficiently trained, the set of extraction models may be used for extracting electrical features from an integrated circuit design. The lower half of FIG. 1 conceptually illustrates how the set of extraction models are used for extraction. FIG. 1 will be described with reference to FIG. 3 that illustrating a flow diagram that describes how extraction models may used to extract electrical features from an integrated circuit design.

As with prior extraction system systems, the overall extraction problem is first divided into individual smaller extraction problems. A standard method of dividing the overall extraction problem is to divide the semiconductor integrated circuit into different nets as set forth in step 310.

Next, at step 320, the smaller extraction problems are further divided into small primitive sections that match the extraction models built with reference to FIGS. 1 and 2. For example, to perform capacitance extraction a net is divided into different sections having different two-dimensional capacitance profiles. Then, at step 330, the iterative process of analyzing each different section begins.

First, at step 330, the system selects a specific extraction model associated with the two-dimensional profile that matches the current section. Then at step 340, the system provides the data parameters that specifically define the current two-dimensional profile to the selected extraction model to obtain a predicted electrical characteristic value from the extraction model.

At step 360, the system determines if this is the last different section of the net. If this is not the last section, then the system returns to step 340 to analyze the next section. If this is the final section then the system proceeds to step 380 where all the electrical characteristic values for the different sections are combined together to determine the overall electrical characteristics of the net.

Neural Networks

As previously set forth, neural networks are often used to implement artificial intelligence systems that perform machine learning. A neural network is a complex mathematical model of connections and weights designed to store knowledge such that input data is transformed into output data using the stored knowledge.

Figure 4:
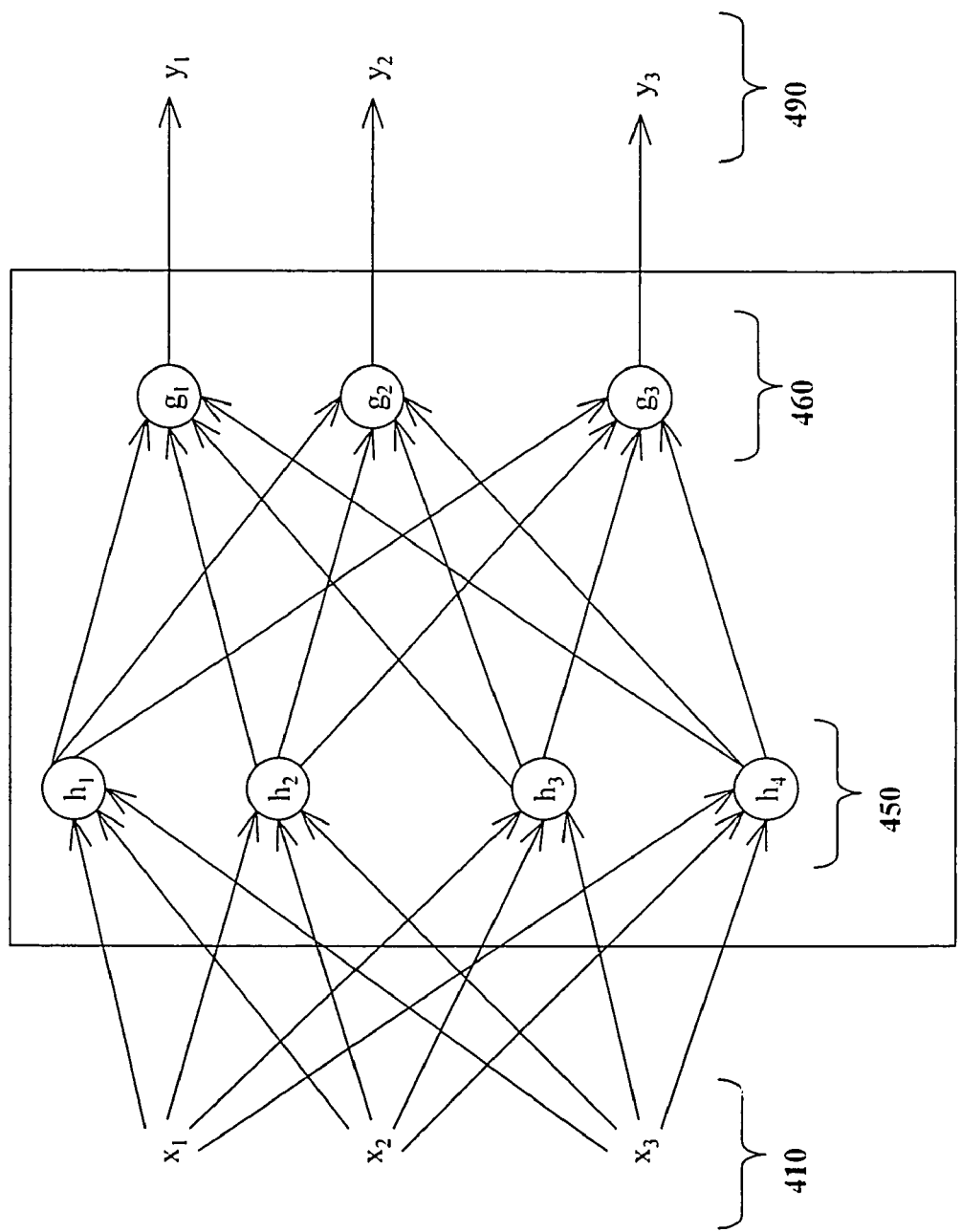
FIG. 4 illustrates a conceptual diagram of an example feed-forward neural network (also known as a multi-layer perceptron or a back-propagation network).

FIG. 4 illustrates an example feed-forward neural network (also known as a multi-layer perceptron or a back-propagation network). In the feed-forward neural network of FIG. 4 there are four hidden units $h_1$, $h_2$, $h_3$, and $h_4$, 450 that combine three input values $x_1$, $x_2$, and $X_3$ 410 (collectively referred to as input vector X). Three output units $g_1$, $g_2$, and $g_3$ 460 combine the output from the four hidden units 450 to generate three output values $y_1$, $y_2$, and $y_3$ 490 (collectively referred to as output vector Y).

In one embodiment, the hidden units $h_1$, $h_2$, $h_3$, and $h_4$, 450 combine the three input values $x_1$, $x_2$, and $x_3$ 410 with the following formula:

$$h_j(X) = \tan h(a_j + \Sigma u_{ij} x_i) \qquad (1)$$

The three different output units $g_1$, $g_2$, and $g_3$ 460 illustrated in FIG. 4 combine the output from the four hidden units 450 with the following formula:

$$y_k(X) = g_k(X) = b_k + \sum_j v_{jk} h_j(X) \qquad (2)$$

Where $u_{ij}$ and $v_{jk}$ are "weights" in the hidden units $h_j$ and output units $g_k$ of the neural network, respectively. Similarly, $a_j$ and $b_k$ are "biases" in the hidden units $h_j$ and output units $g_k$ of the neural network, respectively.

Figure 5:
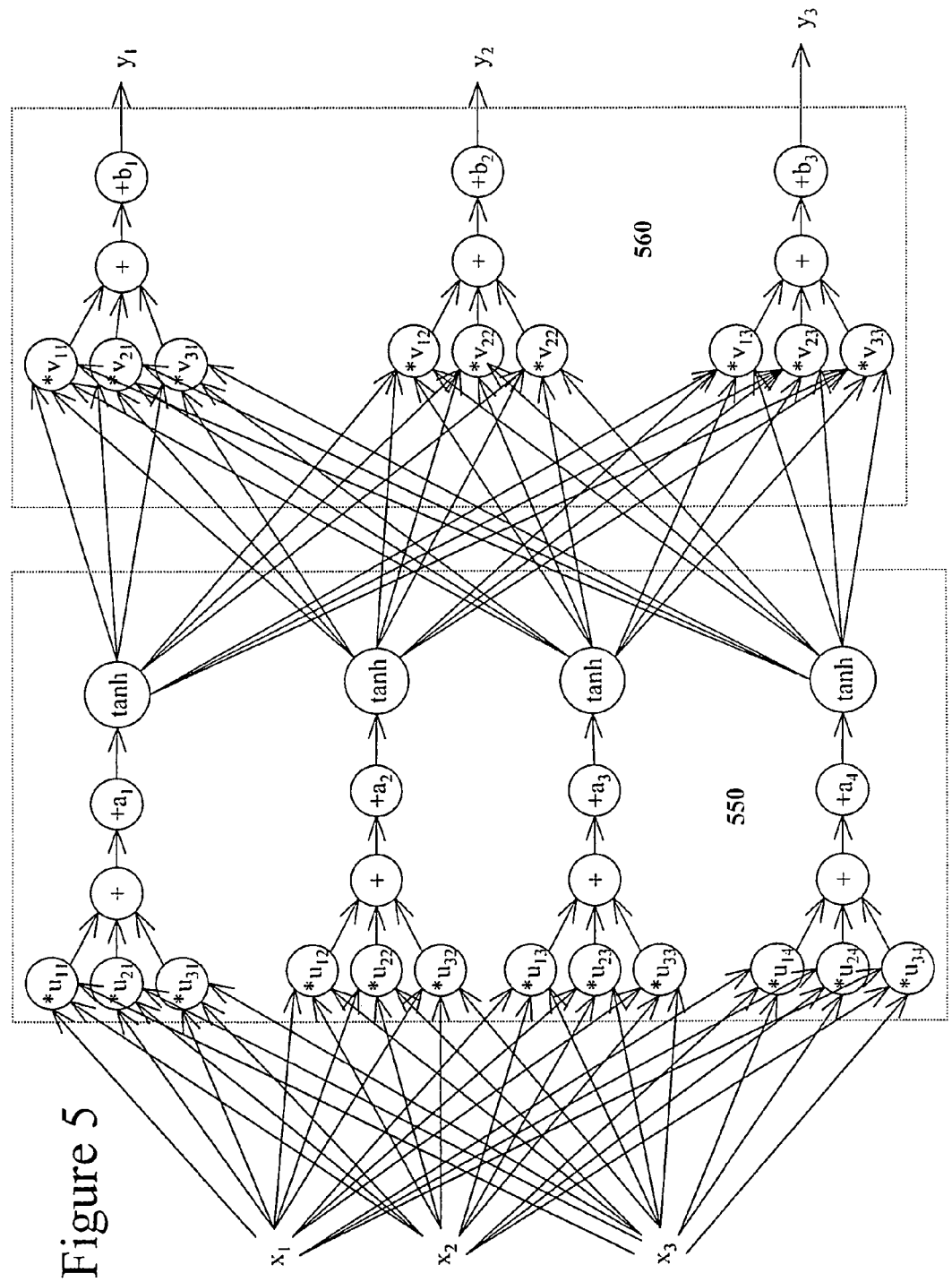
FIG. 5 illustrates a more detailed version of the neural network of FIG. 10 for an embodiment implemented with a linear combination of sigmoid functions.

FIG. 5 illustrates a more detailed version of the neural network of FIG. 4 for an embodiment implemented with equations (1) and (2). Area 550 describes the hidden units 450 of FIG. 4 and area 560 describes the output units 460 of FIG. 4.

The hyperbolic tangent function (tan h) of equation (1) is an example of a sigmoid function. A sigmoid function is a non-linear function, $S(z)$, that passes through the origin, approaches +1 as z approaches infinity and approaches -1 as z approaches negative infinity. It is known that as the number of hidden units in a neural network increases, any function defined on a compact set can be very accurately approximated by linear combinations of sigmoid functions. Thus, the linear combination provided by the output units 460 as set forth in equation (2) can accurately represent nearly any function provided there are enough hidden units in the neural network.

Thus, with the proper values for the weights ($u_{ij}$ and $v_{jk}$) and biases ($a_j$ and $b_k$), a neural network can be used to accurately approximate a complex unknown function that specifies the electrical characteristics (the extraction problem solution) for a particular configuration provided that the configuration can be complete parameterized as a set of input variables. As previously set forth, parameters that will be constant in both the training set and the actual extraction problems to be solved may be discarded from the parameter set. Discarding constant parameters simplifies the creation of the neural network.

The task of determining the proper values for the weights ($u_{ij}$ and $v_{jk}$) and biases ($a_j$ and $b_k$) for a neural network is not a trivial task. However, the fields of artificial intelligence and machine learning have devised a number of different techniques for determining the neural network weights and biases as is well known in the art. In one embodiment, a single set of best weights and biases is selected by training said neural network with a set of known examples. In such an embodiment, the neural network predicts the electrical characteristics of integrated circuit extraction problems using said best weights and biases.

Bayesian Learning

The present invention proposes the use of Bayesian inference for performing machine learning in one embodiment. In general, a Bayesian inference system attempts to infer a function that maps a set of input values (the input vector) to a set of output values (the output vector). In the Bayesian approach, one does not select a single "best" set of weights and biases for the neural network. Instead, one integrates the predictions from all possible weight & bias vectors over a posterior weight distribution that combines information from the data with a prior bias toward more plausible weight vectors. Thus, instead of outputting a specific single output result for a given input, a Bayesian network outputs a probability distribution of the result. To generate a specific result, one may integrate over the probability distribution and thus select the mean as a specific result.

For example, a Bayesian network may be trained on a known set of training data D where $D=\{(X_i, Y_i): i=1 \text{ to } n\}$ to build a Bayesian network model $B(X)$. The Bayesian network $B(X)$ outputs a probabilistic distribution $p(Y|X)=B(X)$ for a given value novel input vector X. Specifically, the Bayesian network outputs an approximation of a probabilistic distribution $p(Y|X)$ based on the training data D. There are both statistical and computational reasons as to why it is an approximation. The approximation may be referred to as $p(Y|X, D)$ to indicate that it is dependent on the specific training data D.

A particular Bayesian model will be referred to as model H. In a preferred embodiment, the Bayesian model uses the neural network model defined in equations (1) and (2). Each Bayesian model H may be further defined by an m dimensional model parameter vector W that specific parameters of that particular model H. For example, in the neural network model defined in equations (1) and (2), the parameter vector W defines the weights ($u_{ij}$ and $v_{jk}$) and biases ($a_j$ and $b_k$) for the neural network.

The Bayesian model H specifies a probability distribution function $f(X, W)$ in terms of the input vector X and the model parameter vector W. Bayesian inference starts from "prior knowledge" (referred to simply as a "prior"), which is then updated in the light of the training data, giving rise to the posterior distribution $p(Y|X, W)$. The prior is intended to capture our expectations about the model parameters, before we have seen any training data.

The prior knowledge may be formulated as a probability distribution over the quantities with which the Bayesian inference is concerned. The prior probability distribution for the m dimensional parameter vector W is $p(W|H)$. Priors are often specified as functions of variables, $\alpha$, called "hyperparameters". Thus, a prior probability distribution dependent on the hyperparameters $\alpha$ can be specified as $p(W|\alpha, H)$. (The hyperparameters $\alpha$ may be a single value or a vector.) Prior information about the value of a hyperparameter can also be expressed as a "hyperprior" which states the expectations about the value of the hyperparameter $\alpha$.

The data dependent term is given in a probabilistic term known as likelihood. Specifically, the likelihood defines the probability of a particular output value given the input data X, the model parameters W, and the model H. The likelihood of a particular output value Y can be expressed as $p(Y|X, V, H)$.

Using Bayes' Rule, the posterior probability density of model parameters W conditioned on the hyperparameters $\alpha$ can be defined as:

$$p(W|\alpha, D, H) = \frac{p(Y|X, W, H)p(W|\alpha, H)}{p(Y|X, \alpha, H)} \qquad (3)$$

To get rid of the hyperparameters $\alpha$, the posterior probability density of model parameters W may be integrated with respect to the posterior distribution of the hyperparameters.

$$p(W|D,H) = \int p(W|\alpha,D,H) p(\alpha|D,H) d\alpha \qquad (4)$$

The posterior distribution of the hyperparameters α can be obtained using Bayes' rule:

$$p(\alpha|D, H) = \frac{p(Y|X, \alpha, H)p(\alpha|H)}{p(Y|X, H)} \qquad (5)$$

where the likelihood for the hyperparameters α is given by $$p(Y|X,\alpha,H) = \int p(Y|X,W,H)p(W|\alpha,H)d^mW \qquad (6)$$

As previously set forth, the Bayesian inference system does not give a particular output for a given model with defined model parameters. Instead, it outputs a probability distribution over the parameter space. To use a Bayesian model to make predictions, one must integrate over the posterior distribution of the model parameters given in equation (4). Thus, the predictive probability distribution for $$p(Y|X,D,H) = \int p(Y|X,W,D,H)p(W|D,H)d^mW \qquad (7)$$

To make a specific prediction, one may integrate over the probability distribution to obtain a mean value of the predictive probability distribution. Thus, the predicted mean would be $$\hat{y} = \int y p(y|X,D,H) dy \qquad (8)$$

Detailed information on using Bayesian inference to train neural networks can be found in the paper "Bayesian Learning in Feed Forward Neural Networks" by Carl Edward Rasmussen of the Department of Computer Science at the University of Toronto.

Monte Carlo Method Using Metropolis

Symbolic evaluation of the inferences made in the previous section on Bayesian learning is generally not possible. Thus, numerical computation is needed to evaluate the various complex integrals used in Bayesian learning.

Even using numerical computation, it is difficult to perform Bayesian learning for a neural network. Specifically, the very high dimensions of the integral in equation (7) for complex models becomes quiet unwieldy. To simplify the computation, one may use random sampling techniques. Such techniques are often referred to as the "Monte Carlo" method in reference to the famous casino resort. It is difficult to sample the large solution space such that the sampling technique must actively search for regions with high probability.

The basic sampling technique is to approximate an integral over a function multiplied by a probability function by determining the mean of the function when sampled from the probability distribution. Thus, for n sufficiently large:

$$\int f(x)p(x)dx \approx \frac{1}{n}\sum_{i=1}^{n} f(x_i) \qquad (9)$$

where the vectors $x_i$ are randomly drawn from the probability distribution p(x).

There are a number of different methods of implementing Monte Carlo techniques for integration purposes. One well-known method is the Metropolis algorithm that employs Markov Chains in the Monte Carlo method. Fundamentals of the Metropolis algorithm can be found in the paper "Equation of state calculations by fast computing machines" by N. Metropolis, A. W. Rosenbluth, M. N. Rosenbluth, A. H. Teller, and E. Teller, in the "Journal of Chemical Physics", volume 21, pages 1087 to 1092.

The Metropolis algorithm was originally proposed as a method to simulate a system in a heat bath progressing toward thermal equilibrium. In the Metropolis algorithm, the system generates a new proposed state j of potential energy $E_j$ from a given current state i of potential energy $E_i$, by a small change in the system. If the new proposed state j has a smaller potential energy than the initial state I, then make state j the new current state, otherwise the system accepts state j with a probability of:

$$A_{ij}(T)dx = e^{-\frac{(E_j-E_i)}{kT}} \qquad (10)$$

where k is a constant and T is the temperature of the heat bath. After a large number of iterations, the states visited by the algorithm forms an ergodic Markov Chain with a canonical distribution as the stationary distribution for the chain.

In one embodiment where $X_t$ defines the state of the system at time t, the one step transition probabilities for the Metropolis algorithm are:

$$p_{ij}(T) = P[X_{t+1} = j|X_t = i] = \begin{cases} G_{ij}(T)A_{ij}(T) & \text{if } i \neq j \\ 1 - \sum_{k \neq j} p_{ij}(T) & \text{if } i = j \end{cases} \qquad (11)$$

where $G_{ij}(T)$=probability of generating j from i $A_{ij}(T)$=probability of accepting j from i Referring back to equation (9), the Metropolis algorithm can be used to generate a Markov chain of vectors $x_i$ in order to use equation (9) to evaluate a difficult integral. Specifically, a candidate vector $\tilde{x}_{t+1}$ is generated for each iteration t by picking the vector according to some distribution p($\tilde{x}_{t+1}|x_t$). The candidate vector $\tilde{x}_{t+1}$ is accepted if it has lower energy than the previous state; if it has higher energy, it is accepted with a probability of $e^{-(E_{t+1}-E_{ti})}$. Stated formally:

$$x_{t+1} = \begin{cases} \tilde{x}_{t+1} & \text{if } \text{random}[0, 1) < e^{-(E_{t+1}-E_{ti})} \\ x_t & \text{otherwise} \end{cases} \qquad (12)$$

Thus, using the vector selection of equation (12), a Markov chain of vectors may be generated to numerically solve integrals using the Monte Carlo method.

Although the Monte Carlo method implemented with the Metropolis algorithm works reasonably well, it make take a very large number of iterations to accurately numerically solve integrals using the Metropolis algorithm. This is because the Metropolis algorithm essentially performs a "random walk" through the solution space with very small steps. It would be desirable to have a system that is faster at finding a good solution.

Hybrid Monte Carlo Method

To find a good solution more rapidly, a Hybrid Monte Carlo technique may be used. A Hybrid Monte Carlo technique takes advantage of gradient information provided by backpropagation networks in order to guide the search toward solutions that have a high probability of being accepted.

The Hybrid Monte Carlo technique considers both "kinetic" energy and potential energy instead of just the potential energy considered by the Metropolis algorithm. Thus, Hamiltonian mechanics are used. To represent the overall state of a system, the Hybrid Monte Carlo technique uses two vectors: a position state vector Q (used to determine the potential energy in the system) and a momentum state vector K (used to determine the kinetic energy of the system). The overall energy of the system is defined by adding both the potential energy and the kinetic energy. Specifically, the overall energy of the system [H(Q, K)] is defined by $$H(Q, K) = E(Q) + \frac{1}{2}|K|^2 \qquad (13)$$

To iterate the using the Hybrid Monte Carlo technique, one must generate a Markov chain of vectors $(Q_0, K_0)$, $(Q_1, K_1)$, $(Q_2, K_2)$, etc. The Markov chain is generated using two types of transitions: "dynamic" moves that explore the surfaces over which H is constant and "stochastic" moves that explore states with different values of H with probabilities proportional to $e^{-H}$. One method of changing H is to replace the momentum vector K with one drawn from the stationary momentum distribution:

$$p(K) = (2\pi)^{-\frac{N}{2}} e^{-\frac{1}{2}|K|^2} \qquad (14)$$

The dynamic moves follow Hamilton's equations. Specifically, Hamilton's equations define derivatives of Q and K with respect to a time variable $\tau$ as:

$$\frac{dQ}{d\tau} = +\frac{\partial H}{\partial K} = K \qquad (15)$$

$$\frac{dK}{d\tau} = -\frac{\partial H}{\partial Q} = -\nabla E(Q) \qquad (16)$$

In one embodiment, the system generates a proposed state ($\tilde{Q}_{t+1}, \tilde{K}_{t+1}$) by negating the momentum vector K with a probability of 0.5, then following the above Hamilton dynamics for a time period, and again negating the momentum vector K with a probability of 0.5. Other embodiments may generate proposed vectors in other means.

The generated proposed state ($\tilde{Q}_{t+1}, \tilde{K}_{t+1}$) is then accepted in a manner similar to the Metropolis algorithm. Specifically, the generated proposed state ($\tilde{Q}_{t+1}, \tilde{K}_{t+1}$) is accepted as follows:

$$(Q_{t+1}, K_{t+1}) = \begin{cases} (\tilde{Q}_{t+1}, \tilde{K}_{t+1}) & \text{if } \text{random}[0, 1) < e^{-\Delta H} \\ (Q_t, K_t) & \text{otherwise} \end{cases} \qquad (17)$$

Details on the Hybrid Monte Carlo technique can be found in the paper titled "Hybrid Monte Carlo", by S. Duane, A. D. Kennedy, B. J. Pendleton, and D. Roweth, in Physics Letters B, volume 195, pages 216 to 222.

To implement the Hybrid Monte Carlo technique in a discrete digital environment, one may use the "leapfrog" method. The leapfrog method discretizes Hamilton's equations using a non-zero step size $\epsilon$ as follows:

$$K\left(\tau + \frac{\varepsilon}{2}\right) = K(\tau) - \frac{\varepsilon}{2}\nabla E(Q(\tau)) \qquad (18)$$

$$Q(\tau + \varepsilon) = Q(\tau) + \varepsilon K\left(\tau + \frac{\varepsilon}{2}\right) \qquad (19)$$

$$K(\tau + \varepsilon) = K\left(\tau + \frac{\varepsilon}{2}\right) - \frac{\varepsilon}{2}\nabla E(Q(\tau + \varepsilon)) \qquad (20)$$

Equations (18) to (22) may be iterated a number of times to generate a proposed state ($\tilde{Q}_{t+1}, \tilde{K}_{t+1}$). The greater number iterations that are performed, the faster the space will be explored. However, if too many iterations are performed, the rejection rate may become too high.

The following pseudocode illustrates a sample implementation of the Hybrid Monte Carlo method using the leapfrog method:

```
                # x is the current position vector
g = gradE(x);                   # set gradient using initial x
E = findE(x);                   # set objective energy function
    for l = 1:L                 # loop L times
        p=randn(size(x));       # initial momentum = Normal(O,1)
        H = E + (|p|**2)/;      # evaluate current energy H(x,p)
        xnew = x;               # Start from current position
        gnew = g;               # and current gradient
# Perform leapfrog steps using equations (18), (19) and (20)
        for t = 1:Tau                           # make Tau leapfrog steps
            p = p - epsilon*gnew/2;             # make 1/2 step in p   eq(18)
            xnew = xnew + epsilon*p;            # make step in x       eq(19)
            gnew = gradE(xnew);                 # find new gradient for eq(20)
            p = p - epsilon*gnew/2;             # make 1/2 step in p   eq(20)
        endfor
        Enew = findF(xnew);                     # find new potential energy
```

-continued

```
Hnew = (|p|**2)/2 + Enew;                    # find new value of H
DeltaH = Hnew – H;                           # Determine energy difference
# Decide whether to accept using equation (17)
if (rand( ) < exp(–DeltaH))
            # Proposed state accepted, thus . . .
            x = xnew;               # Set current position x to xnew
            g = gnew;               # Set current gradient g to gnew
            E = Enew;               # Set current energy E to Enew
    endif
endfor
```

Details on implementing the Hybrid Monte Carlo technique in a neural network can be found in the paper "Bayesian Training of Backpropagation Networks by the Hybrid Monte Carlo Method" by Radford M. Neal of the Department of Computer Science at the University of Toronto in Technical Report CRG-TR-91-1 of the Connectionist Research Group (1992) and in Radford M. Neal's 1995 PhD thesis "Bayesian Learning for Neural Networks" for Department of Computer Science at the University of Toronto. Additional useful information may be found in the paper entitled "A Practical Monte Carlo Implementation of Bayesian Learning" by Carl Edward Rasmussen of the Department of Computer Science at the University of Toronto.

To fully describe the present invention, examples of the application of these machine-learning techniques will be provided in the following sections. Specifically, the application of machine learning to interconnect line capacitance and interconnect line resistance will be described.

Capacitance Extraction

Figure 6A:
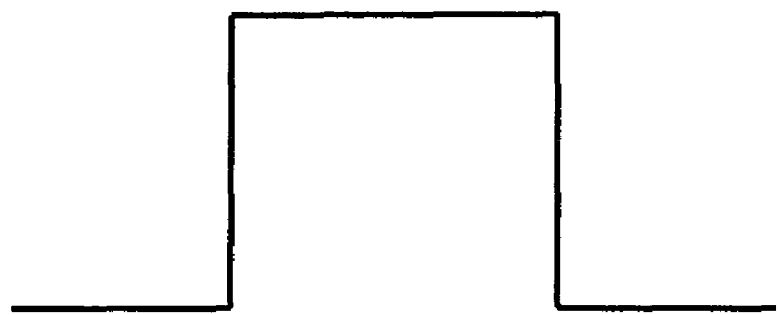
FIG. 6a illustrates an ideal signal pulse.

Semiconductor integrated circuits use metal layers with interconnect wires to carry electrical signals between various circuit elements. These interconnect wires are susceptible to performance degradation due to parasitic capacitance. For example, FIG. 6a illustrates an ideal digital signal pulse. Note that the ideal digital signal pulse has an immediate transition between voltage levels such that the digital signal pulse appears very square. However, no real signal pulse can match the ideal digital signal pulse. One reason that such an ideal cannot be achieved is that parasitic capacitance in all circuits degrades the signal.

Capacitance Effects

Figure 6B:
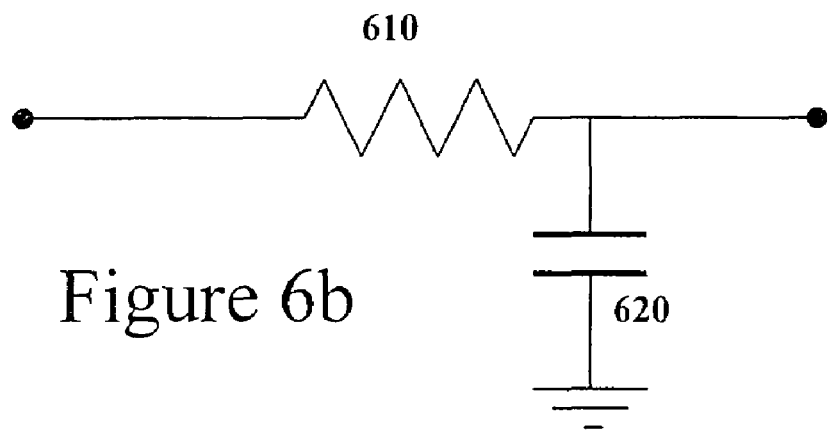
FIG. 6b illustrates a circuit for modeling parasitic capacitance.
Figure 6C:
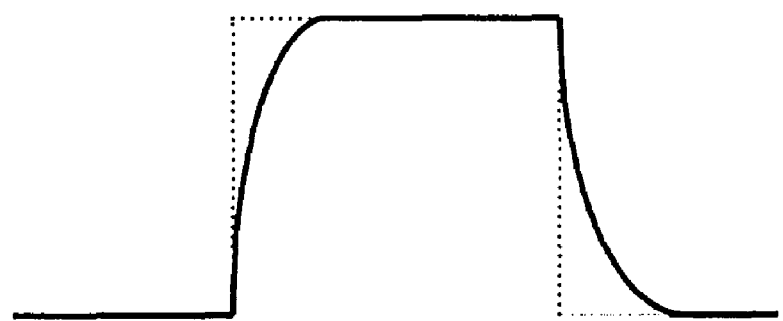
FIG. 6c illustrates the digital signal pulse of FIG. 6a after it has been affected by capacitance.

FIG. 6b illustrates how the parasitic capacitance on interconnect wire may be modeled. The capacitance may be modeled as an "RC" (Resistor-Capacitor) circuit. The resistor 620 lowers the voltage and the capacitor 610 must be charged or drained upon a voltage state change. FIG. 6c illustrates how the ideal digital signal pulse of FIG. 6a is more likely to appear in a real world application. Note that the resistance of resistor 620 and the need to charge the capacitor 610 slow the voltage rise at the beginning of the digital signal pulse. Similarly, the voltage drop at the end of the digital signal pulse is slowed.

Figure 7A:
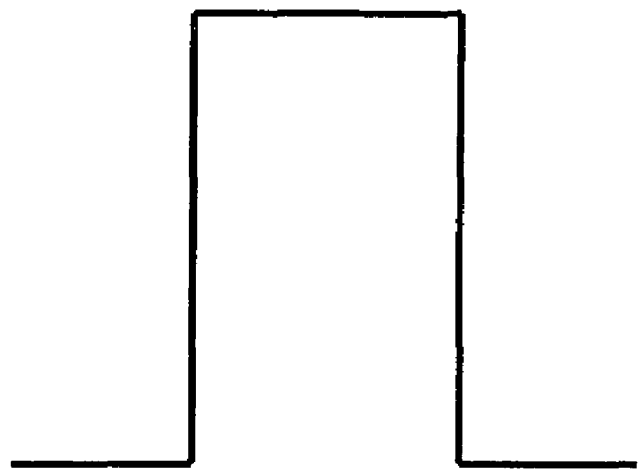
FIG. 7a illustrates an ideal signal pulse.
Figure 7B:
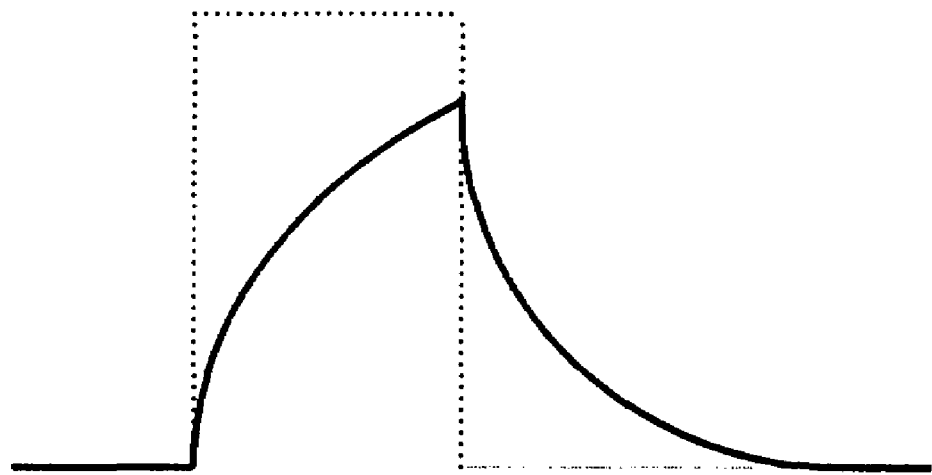
FIG. 7b illustrates a real world signal pulse that did not reach its full voltage level due to parasitic capacitance.

Severe capacitance can cause a circuit to malfunction. For example FIG. 7a illustrates an ideal digital signal pulse and FIG. 7b illustrates the ideal digital signal pulse of FIG. 7a after it has been affected by severe parasitic capacitance. As illustrated in FIG. 7b, the signal fails to reach the full active voltage level when it is affected by severe capacitance. Thus, parasitic capacitance may cause the read-out circuit to sample an incorrect voltage level.

As illustrated with reference to FIGS. 6b and 6c, the resistance and capacitance of an interconnect wire affect the ability of that interconnect wire to carry a signal. Thus, it is desirable to determine these resistance and capacitance values to determine if the performance degradation is too severe. The resistance value of an interconnect wire can be relatively easily estimated using the geometry of the interconnect wire and the material composition of that interconnect wire. However, the capacitance value of an interconnect wire depends on the interconnect wire's proximity to other interconnect wires. Thus, one must consider the effects of all the other nearby interconnect wires to extract the capacitance of a particular interconnect wire.

A Capacitance Extraction Example

In a typical integrated circuit design, all interconnect wires are vertical or horizontal. This orthogonal wiring architecture allows for certain efficiencies in extraction of the capacitance values from an interconnect wire layout. FIGS. 8A to 8H will be used to provide an example of how capacitance may be extracted from an integrated circuit design.

Figure 8A:
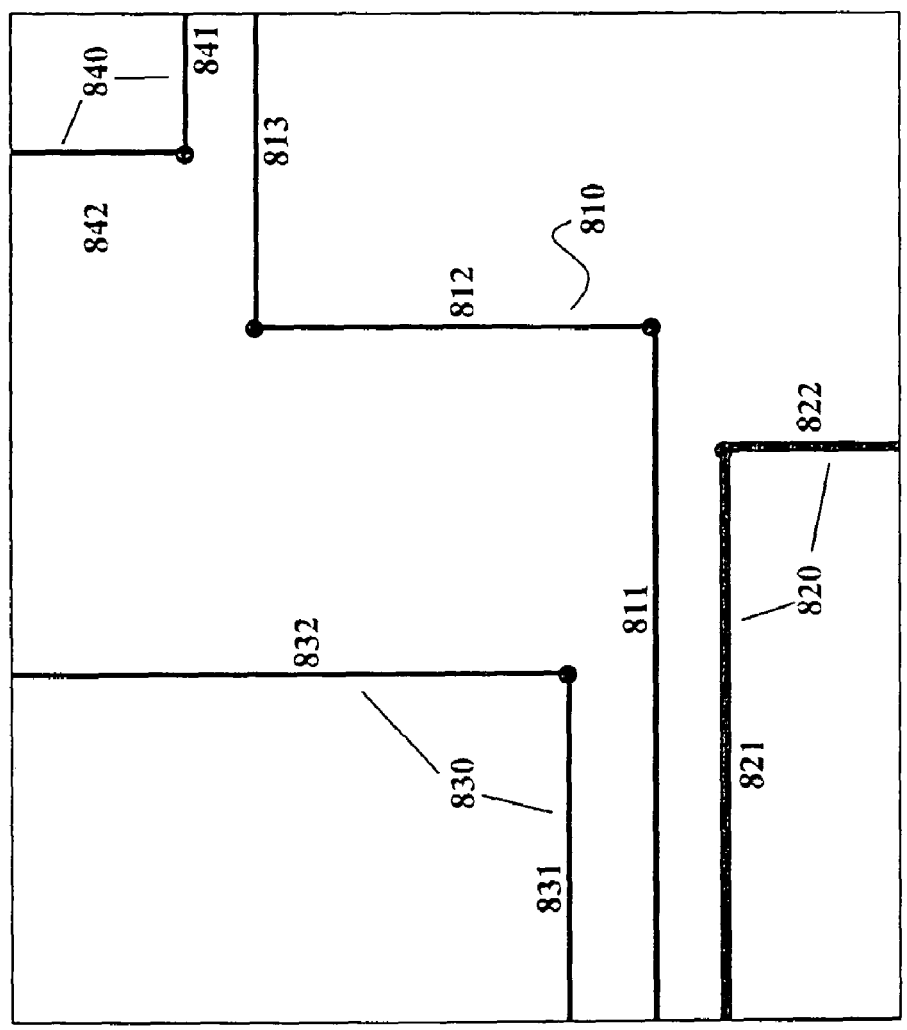
FIG. 8A illustrates an example of interconnect wires arranged for an integrated circuit layout.

FIG. 8A illustrates the top view an example layer of interconnect wiring for an integrated circuit that uses "Manhattan" (restricted to only horizontal and vertical) interconnect wire routing. The layout example of FIG. 8A contains four different "nets" (interconnect wires) 810, 820, 830, and 840. Each net illustrated in FIG. 8A is constructed only from horizontal interconnect wire segments and vertical interconnect wire segments as is required by Manhattan wire routing. For example, net 810 is constructed from horizontal wire segment 811, vertical wire segment 812, and horizontal wire segment 813. Similarly, net 820 is constructed from horizontal interconnect wire segment 821 and vertical interconnect wire segment 812. (Although the example provided with reference to FIGS. 8A to 8H uses Manhattan wiring for simplicity of explanation, the teachings present invention are not limited to extraction on integrated circuits containing Manhattan interconnect line wiring.)

To provide an example of capacitance extraction, the capacitance of a first horizontal portion of critical net 810 in FIG. 8A will be determined. In common capacitance extraction parlance, the interconnect wiring of net 810 will be the "aggressor" wire and the other wire segments that effect the capacitance of net 810 will be the "victim" wires.

Limiting the Capacitance Extraction Problem

Figure 8B:
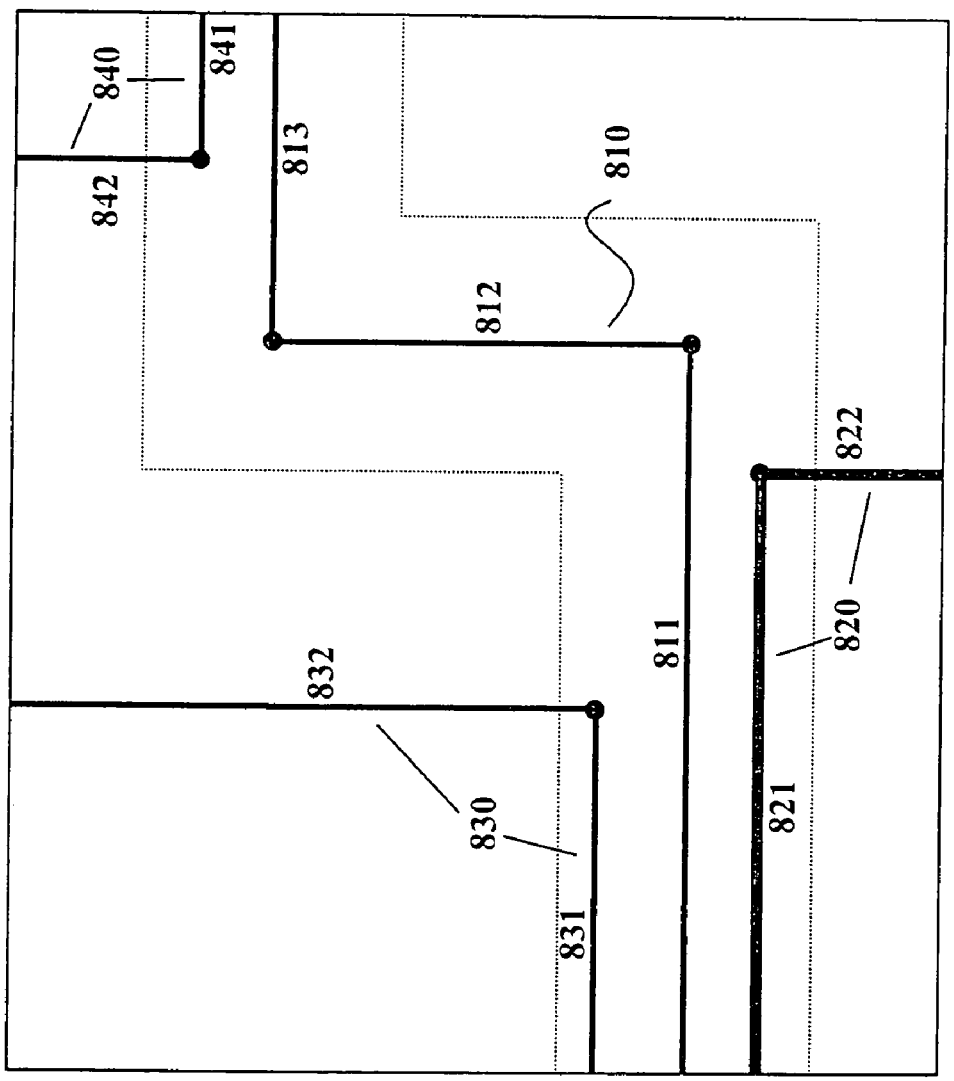
FIG. 8B illustrates the interconnect wires of FIG. 8a with a capacitance effect "halo" drawn around critical net 810.
Figure 8C:
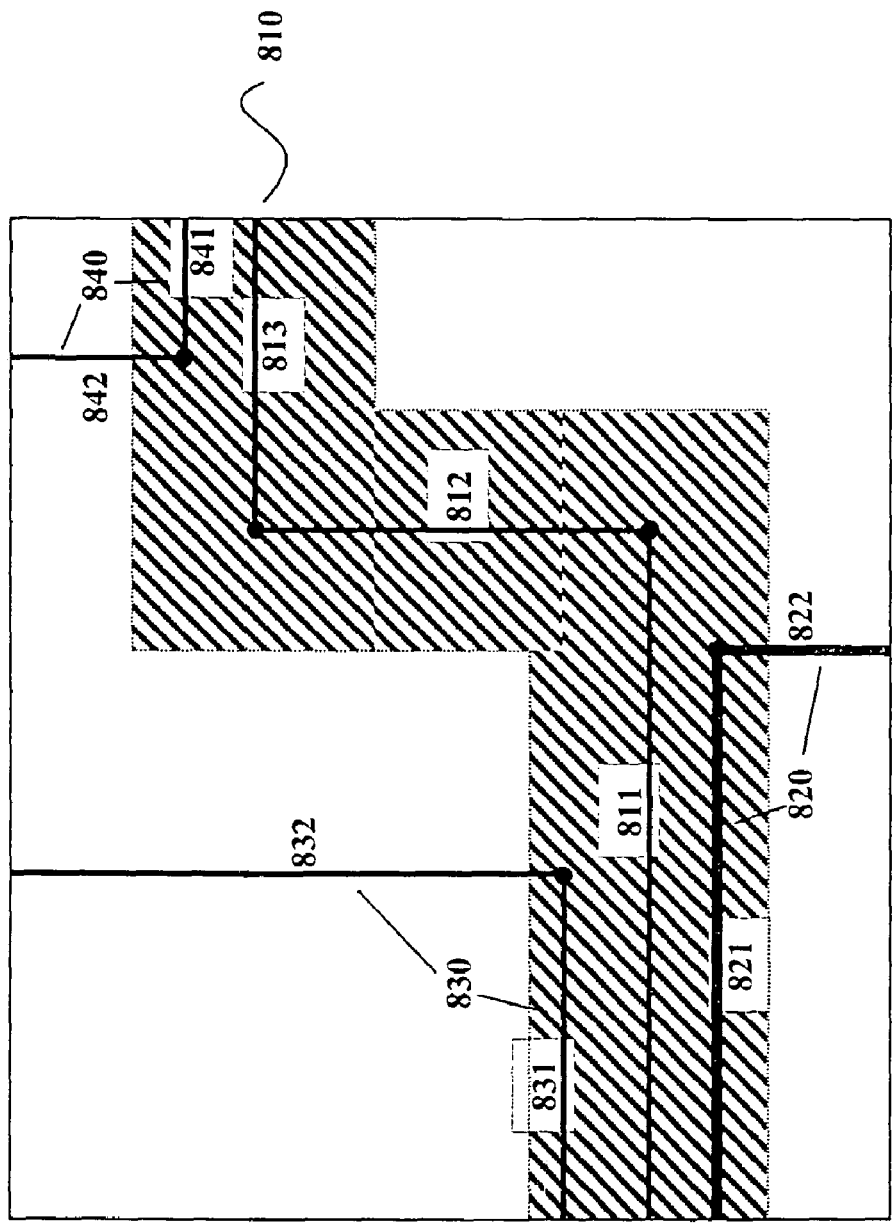
FIG. 8C illustrates the interconnect wires of FIG. 8B with the capacitance effect region around critical net 810 highlighted.

The first step in determining the capacitance of net 810 is to limit the scope of the capacitance extraction problem. Interconnect wires that are far from net 810 will only have a very tenuous effect on the capacitance of net 810 and therefore can be ignored. Thus, FIG. 8B illustrates a "halo" drawn around net 810 that will limit the scope of other interconnect wires considered to materially affect the capacitance of net 810. Specifically, all the interconnect wires within the shaded region of FIG. 8C will be considered to affect the capacitance of net 810. Any interconnect wires not within the shaded region of FIG. 8C will be considered to have no material affect the capacitance of net 810.

The "halo" illustrated in FIG. 8B only appears to limit the scope in two-dimensions along the same layer of the aggressor net 810. However, the halo actually extends in all three dimensions including the vertical dimension not shown. Specifically, interconnect wires on other nearby metal layers are also considered. However, other interconnect layers are not mentioned in this example for simplicity. In one embodiment of the present invention, the capacitance extraction system limits the scope of the problem in the vertical dimension by only considering interconnect wires in metal layers within two layers of the aggressor net.

The most common current technique for computing capacitance effects (also known as extracting capacitance values) due to a three-dimensional configuration of interconnecting wires is to decompose the problem into a series of two-dimensional profile sections that have capacitance values that are generally proportional to their length. The total capacitance of the three-dimensional net configuration is then determined by calculating a weighted sum of the individual two-dimensional profiles where the weights are the lengths of the different two-dimensional profiles. This technique is performed along two different dimensions such that there is both a horizontal and vertical scan of the interconnect wire section.

Thus, the next step in extracting the capacitance in a Manhattan routed integrated circuit is to divide the problem into a series of sections with different two-dimensional profiles. Each section then has a capacitance value that is estimated by multiplying the length of the section with a capacitance-per-length value of the two-dimensional profile. The capacitance-per-length values of the various different two-dimensional profiles are calculated by running a two-dimensional field solver on the two-dimensional profiles.

Figure 8D:
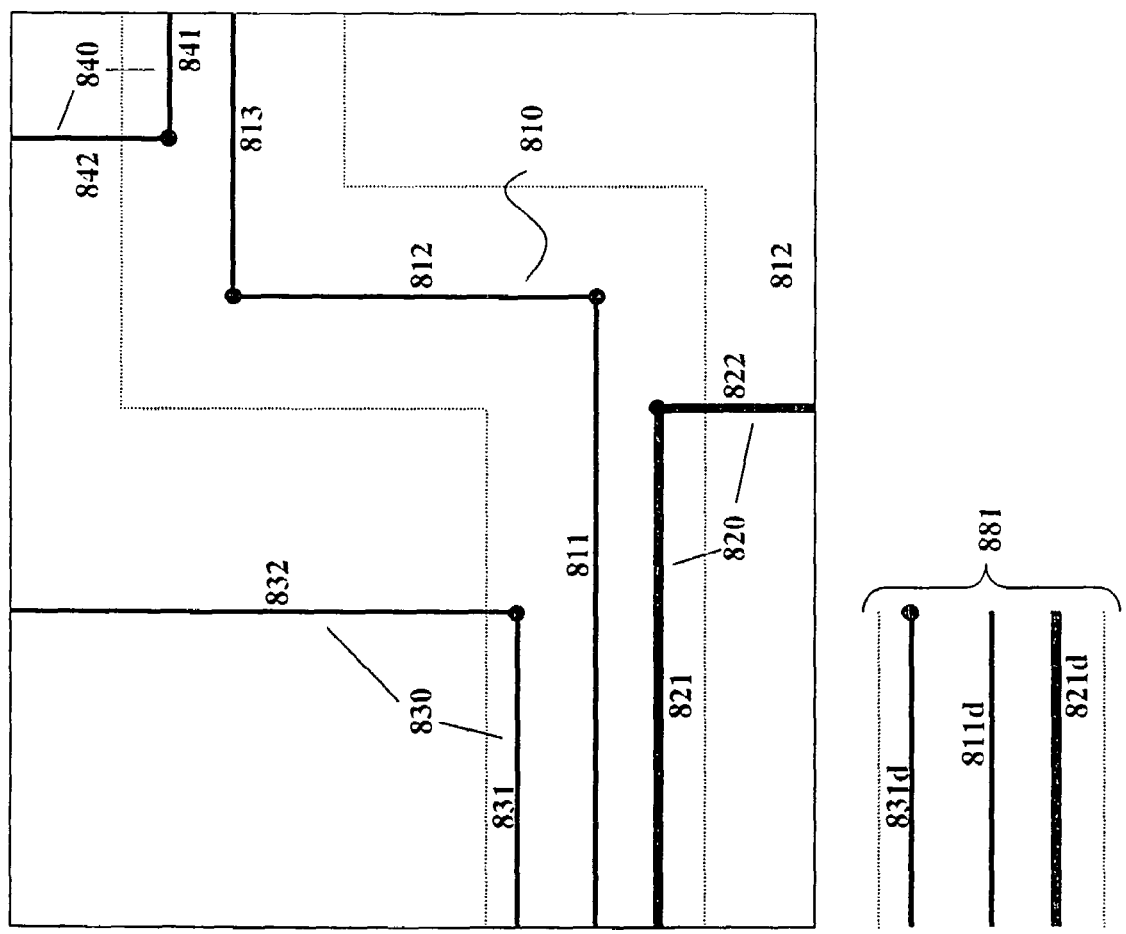
FIG. 8D illustrates the calculation of the capacitance for a first horizontal section of critical net 810.

For example FIGS. 8D to 8H illustrate the horizontal scan of the first section along interconnect wire 811 of net 810 in integrated circuit of FIG. 8A. The scan begins on the left side with FIG. 8D. FIG. 8D illustrates the interconnect wiring of FIG. 8A with a first two-dimensional section 881 of interconnect wire 811 duplicated below the integrated circuit. As illustrated in FIG. 8D, the duplicated section of interconnect wire 811 is surrounded by an environment unchanging along one (horizontal) dimension within the "halo" until horizontal interconnect wire 831 intersects with vertical interconnect wire 832. To calculate the capacitance for this first two-dimensional section of interconnect wiring 881, a modeled capacitance per unit length of section 881 is multiplied by the length of section 881 (the length of interconnect wire 831).

At the point where horizontal interconnect wire 831 intersects with vertical interconnect wire 832, the surrounding environment around interconnect wire 811 of net 810 changes. Thus, a second different section 882 of net 810 is duplicated below the integrated circuit in FIG. 8E. The short section 882 of FIG. 8E is used to take into account the capacitance effect of vertical interconnect wire 832 on horizontal interconnect wire 811 of net 810. To determine the capacitance of section 882, an extraction system multiplies a modeled capacitance per unit length of section 882 by the length of section 882 (the width of vertical interconnect wire 832).

Figure 8G:
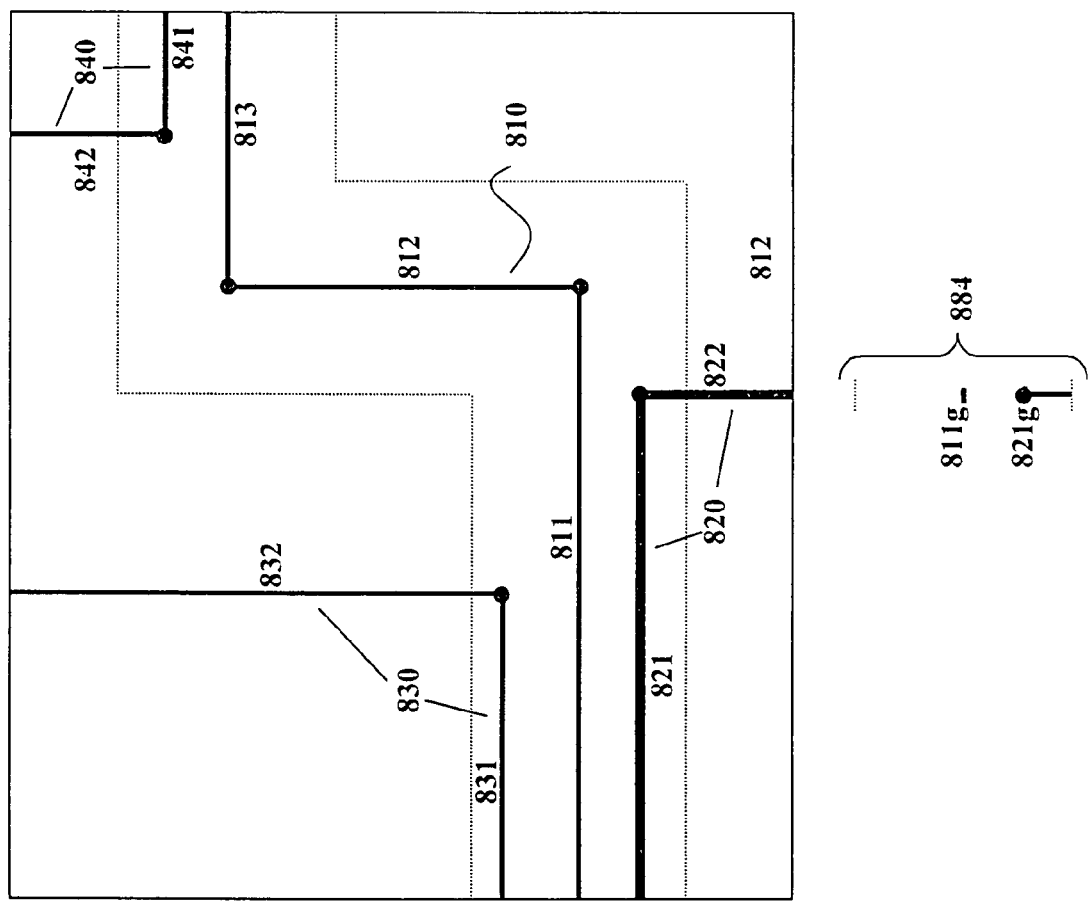
FIG. 8G illustrates the calculation of the capacitance for a fourth horizontal section of critical net 810.

Next, FIG. 8F illustrates the interconnect wiring for an integrated circuit of FIG. 8A with a third two-dimensional section 883 of net 810 duplicated below the integrated circuit. In the third section 883, horizontal wire 811 of net 810 is only affected by horizontal wire 821. The capacitance effect of horizontal wire 821 on interconnect wire 811 per unit length is multiplied by the horizontal distance from vertical interconnect wire 832 to vertical interconnect wire 822. Next, a fourth two-dimensional section 884 of net 810 illustrated in FIG. 8G is taken into account by multiplying the capacitance effect of section 884 by the width of vertical interconnect wire 822.

Figure 8H:
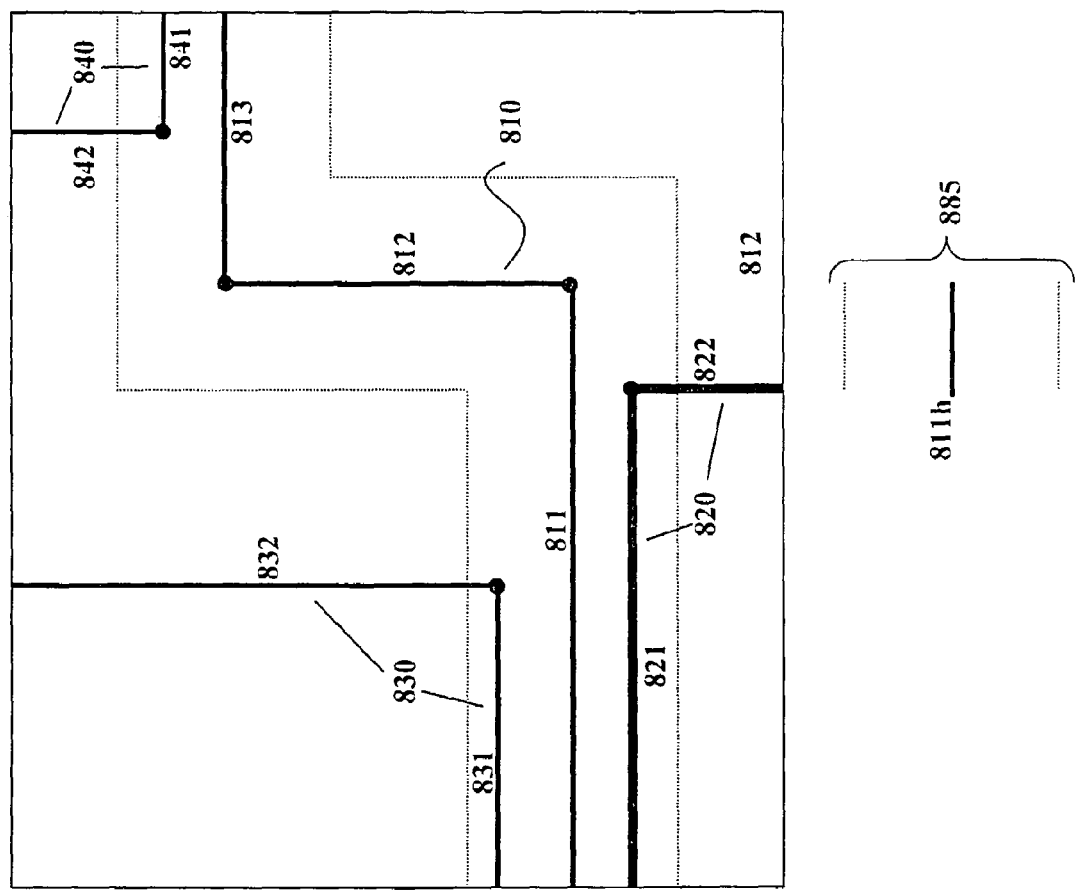
FIG. 8H illustrates the calculation of the capacitance for a fifth horizontal section of critical net 810.

Finally, FIG. 8H illustrates a fifth section 885 of net 810 that consists of the final section of horizontal interconnect wire 811. As illustrated in FIG. 8H, there are no other interconnect wires within the halo around section 885, thus there is not significant capacitance effect for section 885 of net 810.

The fully modeled capacitance along interconnect wire 811 of net 810 is calculated by summing together the modeled capacitance of each of the individual sections 881 to 885 illustrated in FIGS. 8D to 8H, respectively. The capacitance of each individual section is calculated by multiplying the length of that section by the capacitance per unit length of that section profile. Thus the total capacitance for interconnect wire 811 of net 810 may be calculated as follows:

$$\sum_{i=381}^{385} l_i \times C_i =$$

$$l_{381} \times C_{381} + l_{382} \times C_{382} + l_{383} \times C_{383} + l_{384} \times C_{384} + l_{385} \times C_{385}$$

where
  $l_i$=the length of interconnect wiring section i; and
  $C_i$=the capacitance per unit length of interconnect wiring section i.

Determining the Capacitance of a Section

Figure 9A:
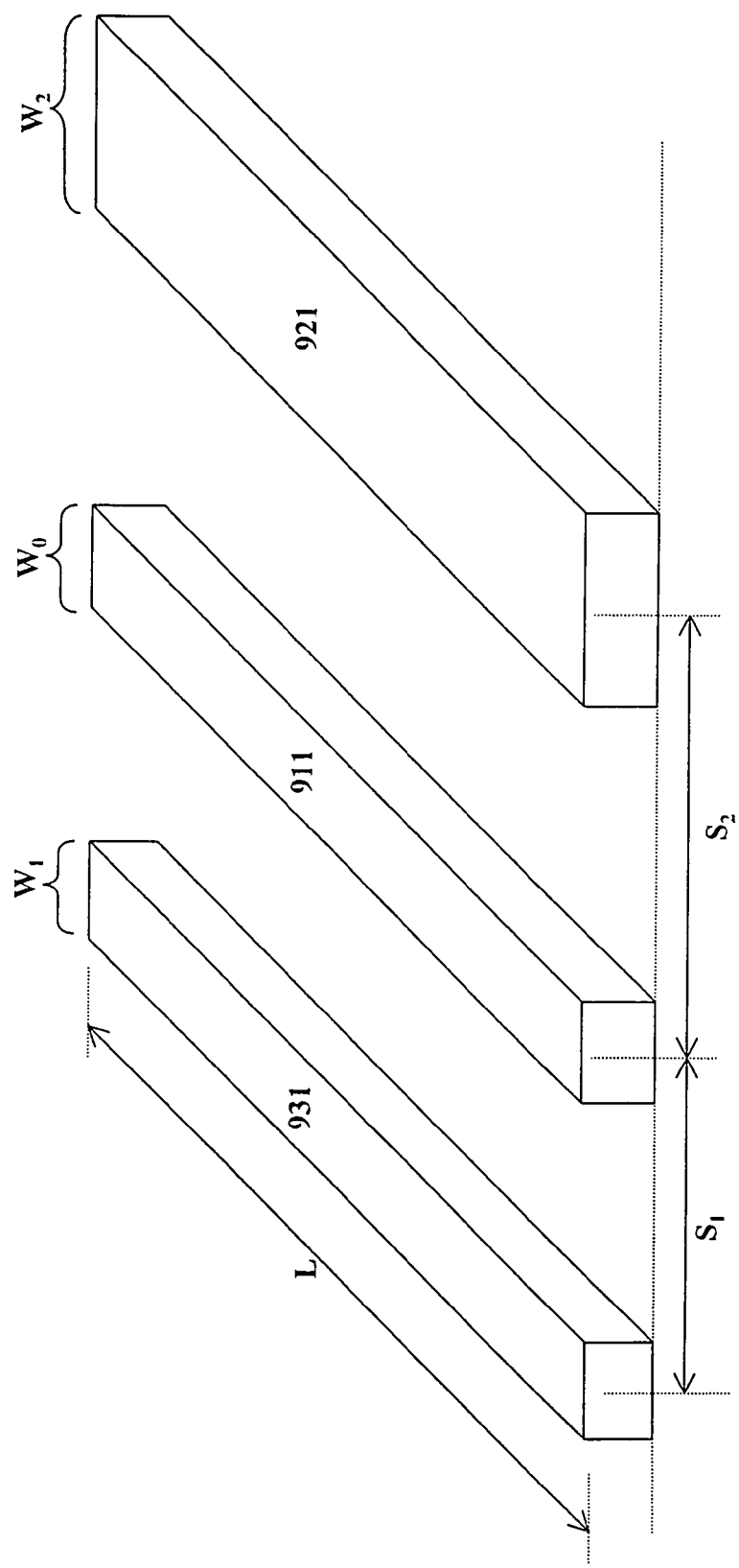
FIG. 9A illustrates a detailed three-dimensional view of interconnect wiring section 881 of FIG. 8D.

Referring back to FIG. 8D, section 881 consists of the aggressor net 811d surrounded by victim nets 831d and 821d. FIG. 9A illustrates a detailed view of how the interconnect wires of section 881 may appear. Capacitance is a physical attribute that is determined by the size, shape, and proximity of conductive materials. The capacitance problem of FIG. 9A can be defined by the length of the section L, the width of each wire section ($W_0$, $W_1$, and $W_2$), the distance between the victim wire 931 and the aggressor wire 911 ($S_1$), and the distance between the victim wires 921 and the aggressor wire 911 ($S_3$).

By ignoring the limited capacitive effects at the ends of the section, the problem can be solved in a two-dimensional realm to determine a two-dimensional capacitance value. Thus, the two-dimensional capacitance problem can be expressed in terms of the five variables $W_0$, $W_1$, $W_2$, $S_1$, and $S_2$ The two-dimensional capacitance value is then multiplied by the length of the section to determine the capacitance of the section.

Figure 9B:
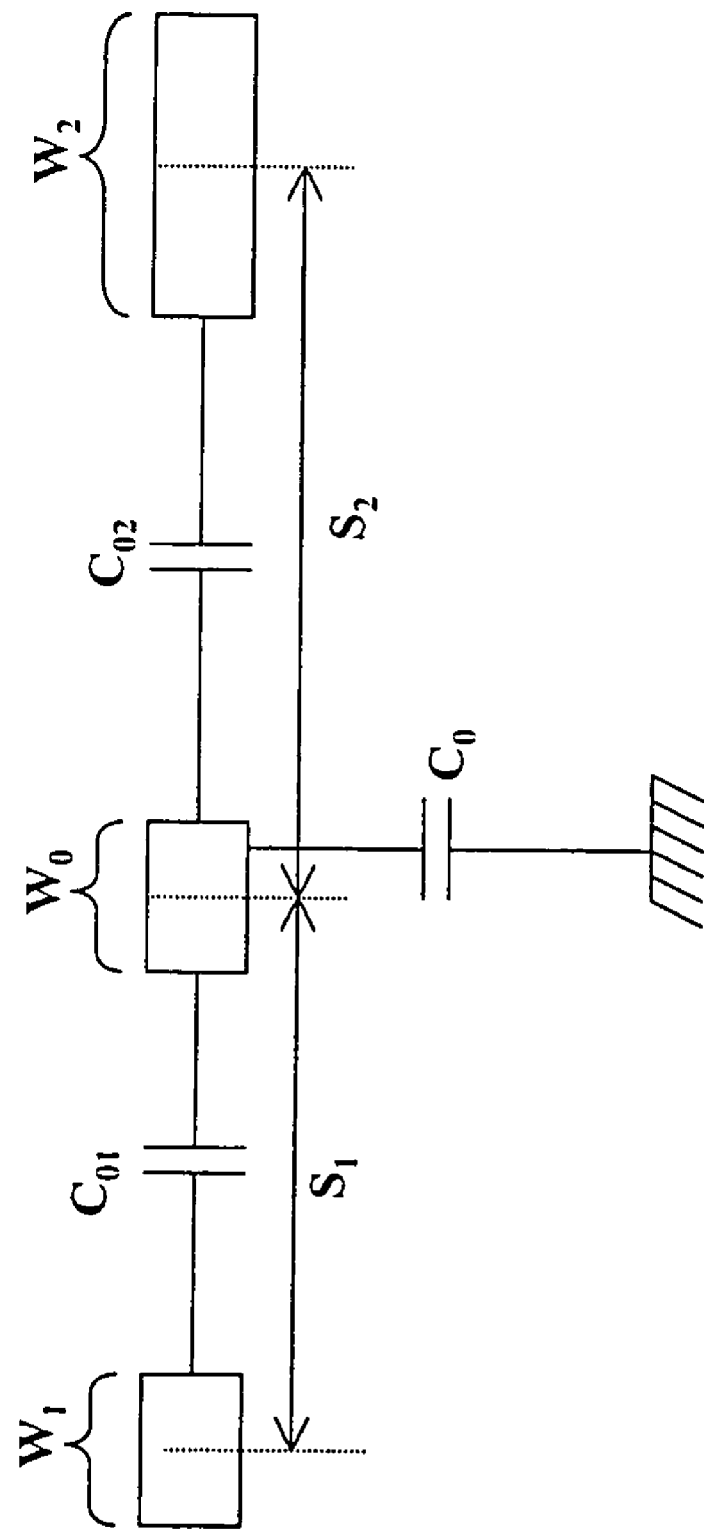
FIG. 9B illustrates a two-dimensional cross section view of interconnect wiring section of FIG. 9A.

FIG. 9B illustrates a two-dimensional cross section of the capacitance problem of FIG. 9A. A two-dimensional field solver can be used to solve the two-dimensional capacitance problem of FIG. 9B. The output of the capacitance extraction is the capacitance between the aggressor wire and the first victim wire $C_{01}$, the capacitance between the aggressor wire and the first victim wire $C_{02}$, and the capacitance between the aggressor wire and the ground plane $C_0$. Thus, the capacitance problem for sections having the two-dimensional profile of FIGS. 9A and 9B can be expressed in terms of five input variables ($W_0$, $W_1$, $W_2$, $S_1$, and $S_2$) and three output values ($C_{01}$, $C_{02}$, and $C_0$). The different output values are often added together and expressed as a single capacitance value C.

More Difficult Capacitance Extraction

The capacitance extraction example set forth in the previous section was a very simplified capacitance extraction problem. Most real world capacitance problems are much more difficult.

Figure 10:
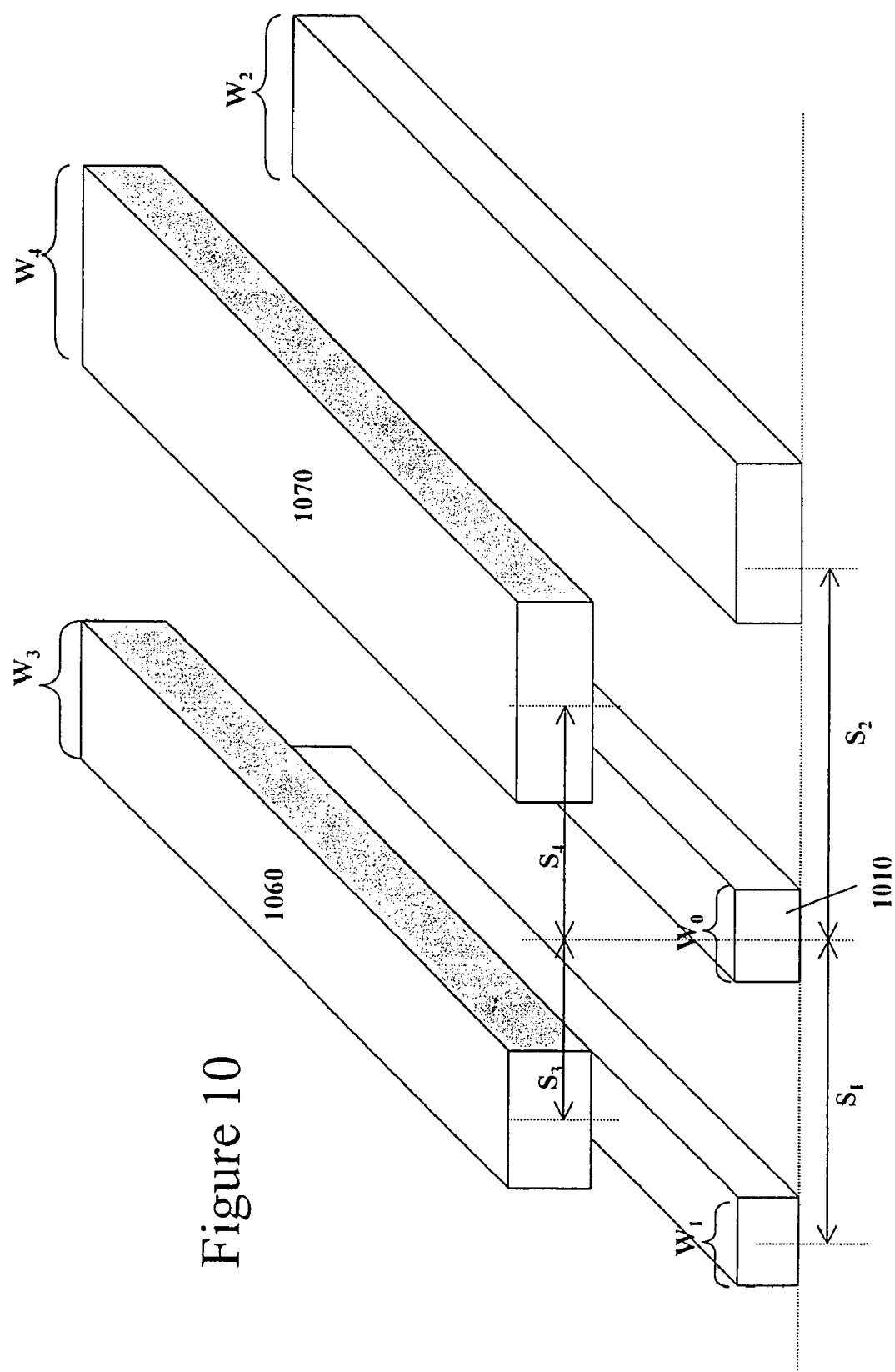
FIG. 10 illustrates a three-dimensional view of a section containing two layers interconnect wiring.

For example, FIG. 10 illustrates a more complex capacitance extraction problem. Specifically, the example of FIG. 10 contains two additional interconnect wires (1060, 1070) on a higher metal layer that should be taken into consideration.

The vertical distance between the different metal layers affects the capacitance calculation. However, the vertical distance between the different metal layers in a particular semiconductor process is a fixed constant value. Thus, in a model is built specifically for a particular semiconductor process and metal layer, the vertical distance may be ignored since it does not vary. Therefore, the capacitance problem for sections having the profile illustrated in FIG. 10 has nine input variables ($W_0$, $W_1$, $W_2$, $W_3$, $W_4$, $S_1$, $S_2$, $S_3$, and $S_4$) and five output values ($C_{01}$, $C_{02}$, $C_{03}$, $C_{04}$, and $C_0$).

Figure 11:
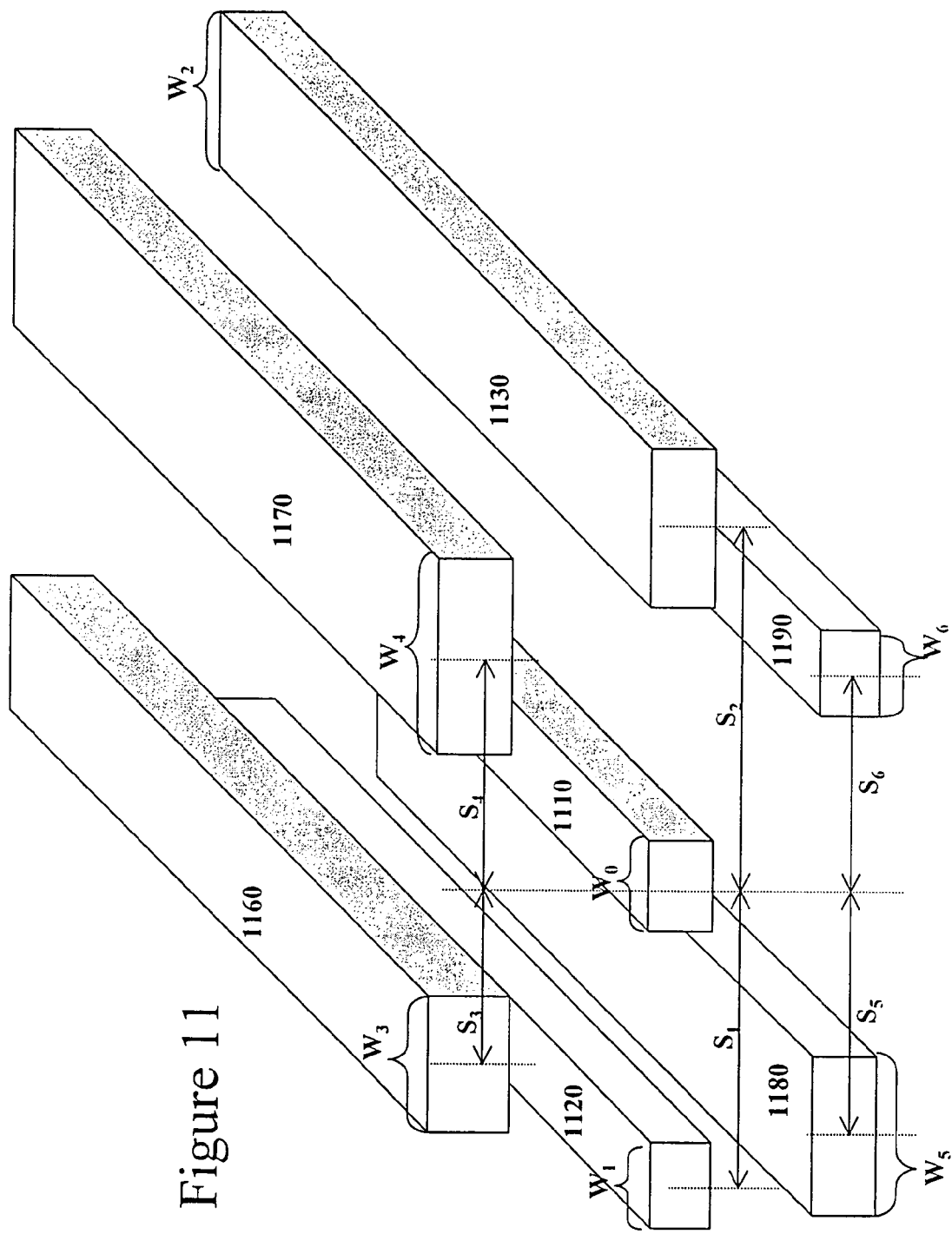
FIG. 11 illustrates a three-dimensional view of a section containing three layers interconnect wiring.

FIG. 11 illustrates yet an even more complex capacitance extraction problem. The capacitance extraction for the profile of FIG. 11 must take into account the capacitance effects from two interconnect wires on the same metal layer (1120, or 1130), two interconnect wires on a higher metal layer (1160, or 1170), and two interconnect wires on a lower metal layer (1180, or 1190). The capacitance problem for sections having the profile of FIG. 11 has thirteen input variables ($W_0$, $W_1$, $W_2$, $W_3$, $W_4$, $W_5$, $W_6$, $S_1$, $S_2$, $S_3$, $S_4$, $S_5$, and $S_6$) and seven output values ($C_{01}$, $C_{02}$, $C_{03}$, $C_{04}$, $C_{05}$, $C_{06}$, and $C_0$).

Capacitance Determination by Interpolation

Many more different two-dimensional capacitance profiles exist and must be handled by a capacitance extraction system. As set forth previously, a vector of input variables can fully define the capacitance extraction problems for the different wiring profiles. Most prior art capacitance extraction systems handle the task of by having several large tables that contain known capacitance values for different two-dimensional profiles. A different capacitance value table exists for each different two-dimensional profile.

Figure 12:
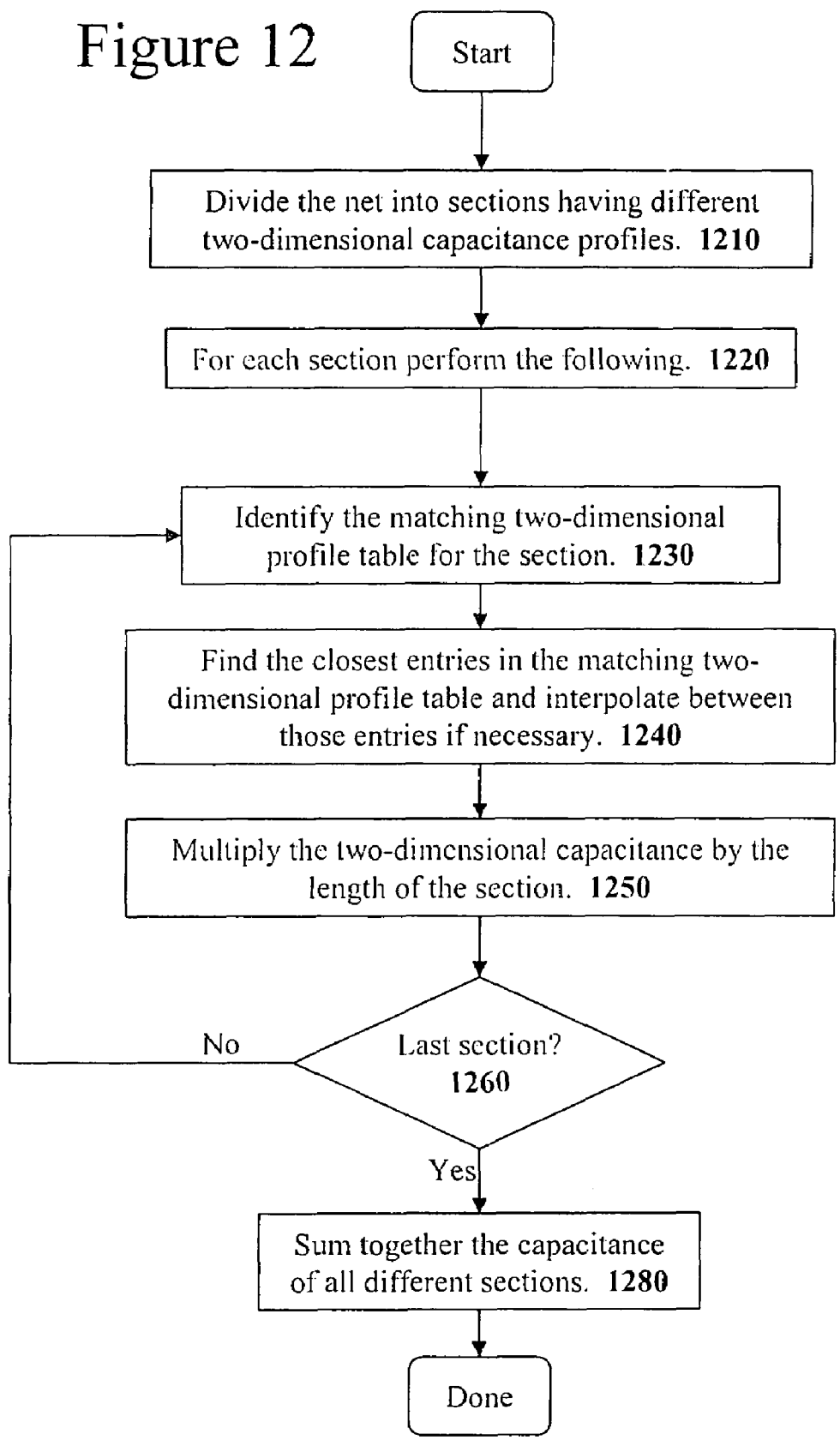
FIG. 12 illustrates a flow diagram describing a prior art method of determining capacitance using capacitance tables and interpolation.

FIG. 12 illustrates a flow diagram that describes how some prior art capacitance extraction systems operate to estimate the capacitance of a particular net using sets of capacitance profile tables. Initially, at step 1210, the system first divides the net into several different sections wherein each different section has a different two-dimensional capacitance profile. This step was previously described with reference to FIGS. 8D to 8H.

Next, at step 1220, the system begins an iterative process to determine the capacitance of each different section. The first step in the analysis of a particular section is to identify the capacitance table for the two-dimensional profile that matches the two-dimensional profile of the section being analyzed as set forth in step 1230. A simple pattern matching system is used to perform this step.

Next, at step 1240, the system locates the closest matching entries in the selected capacitance table. If an exact match is found, then the two-dimensional capacitance of that particular section is known. If no exact match is found, then the system interpolates between the closest entries in the table to determine a two-dimensional capacitance value. Many different systems may be used to perform the interpolation such as a linear interpolation, a least-squares fit, or a polynomial function.

Finally, at step 1250, the system multiplies the determined capacitance per unit length value for that section by the length of that section. The product is stored for future reference.

At step 1260, the system determines if all the different sections of the net have been analyzed. If more sections of interconnect wire need to be analyzed, the system returns to step 1230 to analyze the next interconnect wire section. Otherwise the system proceeds to step 1280. At step 1280, the system sums together the capacitance values computed for all the different sections of the net to determine an overall capacitance of the net.

The pre-computed table and interpolation system set forth in FIG. 12 requires extremely large tables to accurately determine capacitance values in semiconductor layouts for current semiconductor process technologies. Future semiconductor processes will be even more dense and thus will present even more difficult capacitance extraction problems.

Capacitance Extraction Using Machine Learning

As previously set forth, the system of the present invention uses large amounts of capacitance data generated by field-solvers and uses that capacitance data to build a model for predicting capacitance using machine learning. The machine-learning built model is then used to generate capacitance values for novel profiles.

In one embodiment, the system uses a neural network built using Bayesian inference learning. The Hybrid Monte Carlo method of implementing the Bayesian inference learning has been found to be very efficient and accurate. Normally, Bayesian systems generate a number of different models and assign a probability to each model (thus creating a probability density of different possible models). To generate a specific result in such systems, the system may select the mean. However, in one embodiment it was found that most of the models generated by the Bayesian inference system were very similar. Thus, in one embodiment, a single representative [mean?? Average??] neural network model was selected from the probability density of models in order to generate future predictions.

Figure 13:
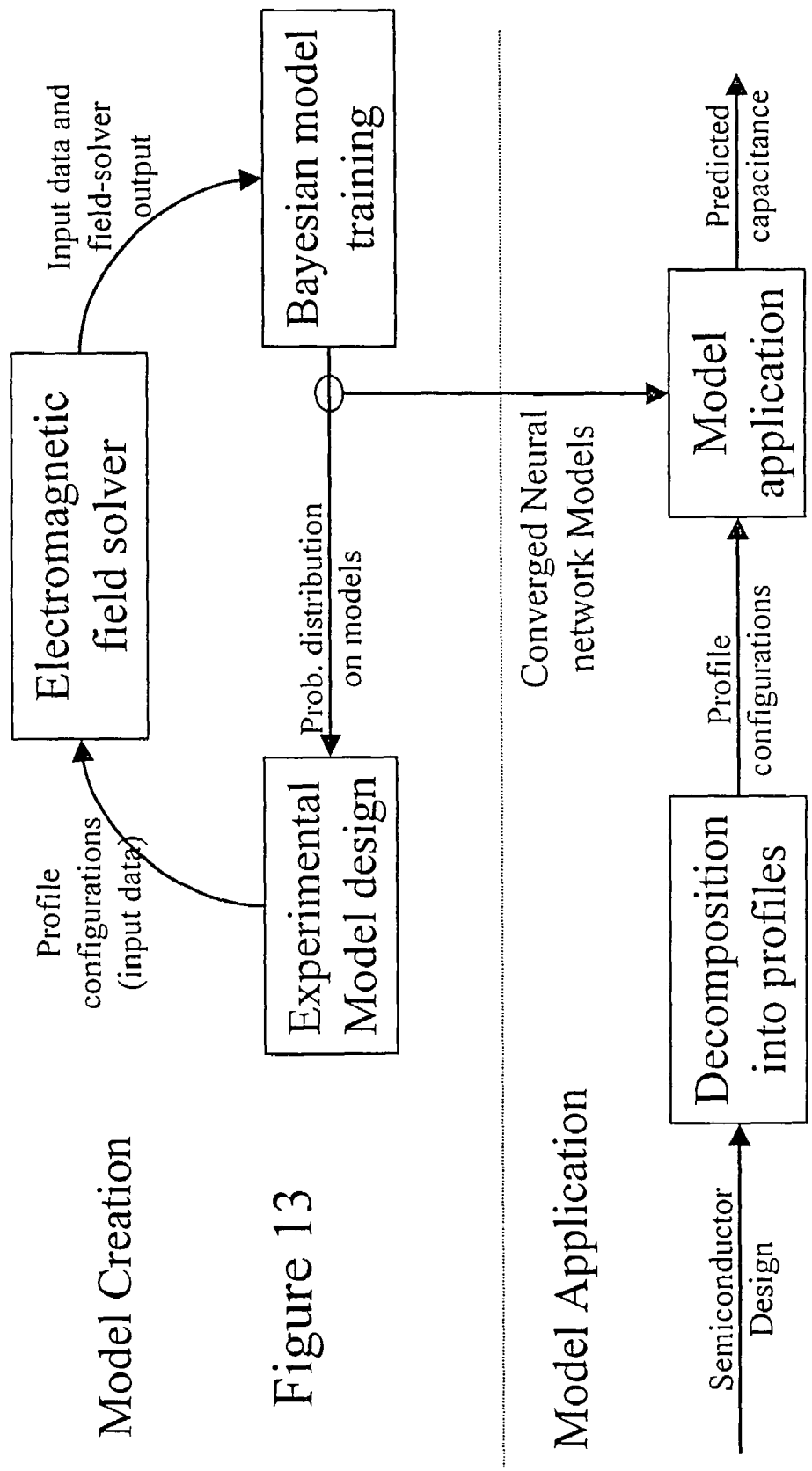
FIG. 13 illustrates a conceptual diagram describing how the present invention generates Bayesian models for capacitance estimation and applies those Bayesian models.

FIG. 13 provides a conceptual diagram that describes the system of the present invention with reference to an implementation that builds neural network models for capacitance extraction using Bayesian inference machine learning. FIG. 13 will be described with reference to FIGS. 14 and 15 that describe the model creation and model application methods, respectively, in greater detail.

Extraction Model Creation

Figure 14:
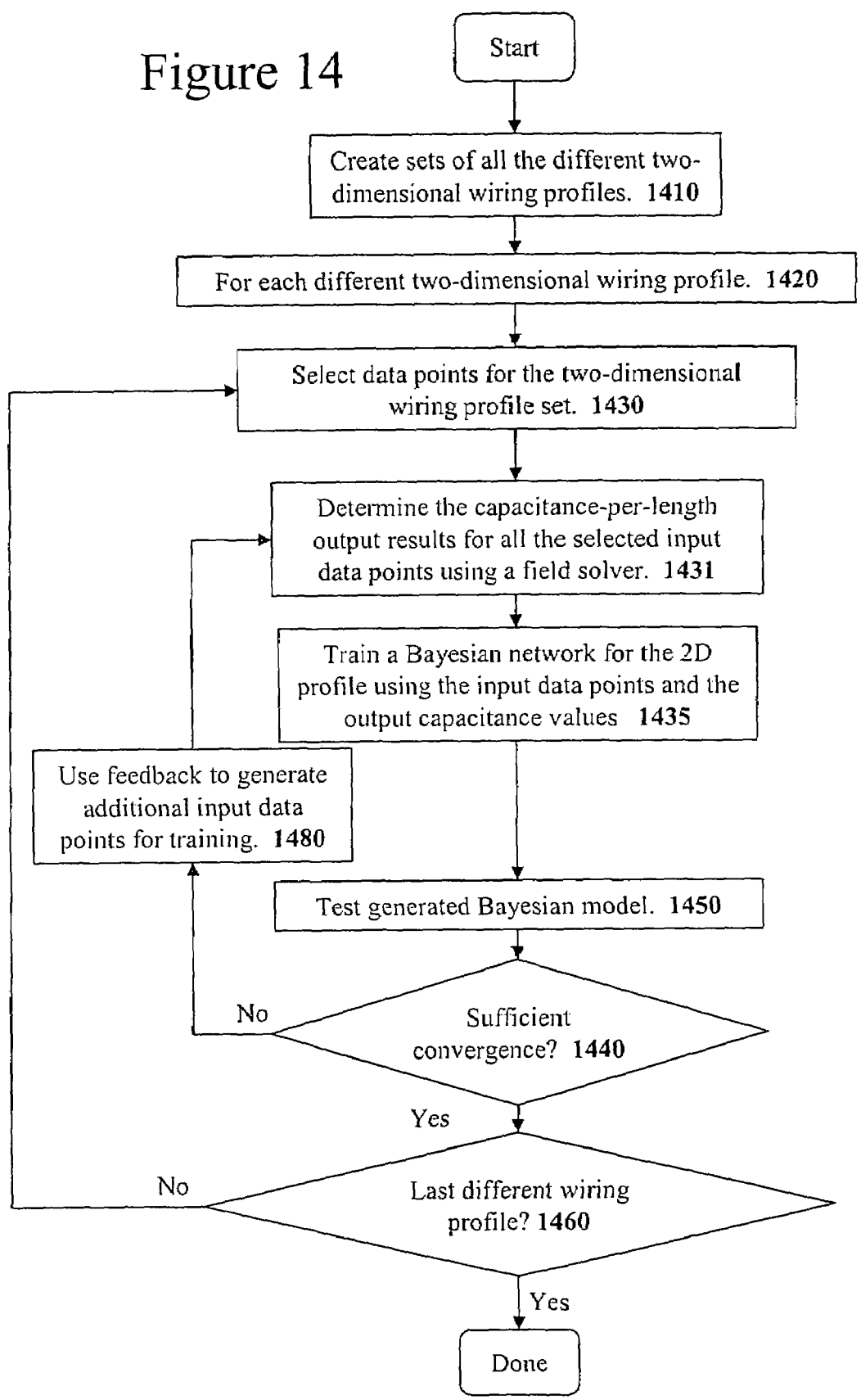
FIG. 14 illustrates a flow diagram describing one embodiment of generating Bayesian models for predicting the capacitance of two-dimensional profiles.

The top half of FIG. 13 describes the creation of a neural network model for capacitance determination using Bayesian inference. FIG. 14 provides a flow diagram for the neural network model creation using Bayesian inference learning. Referring to FIG. 13, the system begins with an experimental model design to select a set of interconnect wire profile configurations that will be used as input data for a field solver. The experimental design techniques are also used to generate the most informative data points. Referring to FIG. 14, the first step 1410 is to create a set of all the different two-dimensional wiring profiles. Next, at step 1420, the system begins to systematically build a model for each different wiring profile.

At step 1430, a loop begins for creating a model. Specifically, at step 1430, an iterative process begins to create a neural network models for each different two-dimensional wiring profile using Bayesian inference learning. At step 1430, an initial set of input data points are selected for the current two-dimensional wiring profile.

Referring back to FIG. 13, the profile configurations (the input data) are provided to field solver. The field-solver is used to generate a set of known output capacitance values that will be used as training data.

Referring back to FIG. 14, at step 1431, the field-solver is used to determine capacitance values for the selected input data points. Then, at step 1435, the input data points and associated output capacitance values are used to train a Bayesian model to predict capacitance values for that two-dimensional wiring profile. At step 1440, the system determines if sufficient convergence has been reached for the model. If the model has not reached sufficient convergence, then feedback from the testing is used to select additional input training data points at step 1480. The system then proceeds back step 1431 to further refine the neural network model using the newly selected input data training points.

If sufficient convergence has been achieved as tested at step 1440, the model is ready to be used for capacitance extraction and the system proceeds to step 1460. At step 1460, a determination is made to see if all the needed extraction models have been created. If all the needed extraction models have not yet been created the method returns back to step 1430 to create an extraction model for the next two-dimensional wiring profile. After creating the extraction models for the different two-dimensional wiring profiles, the models may be used with an extraction system.

Extraction Model Application

Returning to FIG. 13, once the neural network models have been sufficiently trained, the neural network models may be used for extracting capacitance. The lower half of FIG. 13 conceptually illustrates how the neural network models created using Bayesian inference learning are used in extraction.

Figure 15:
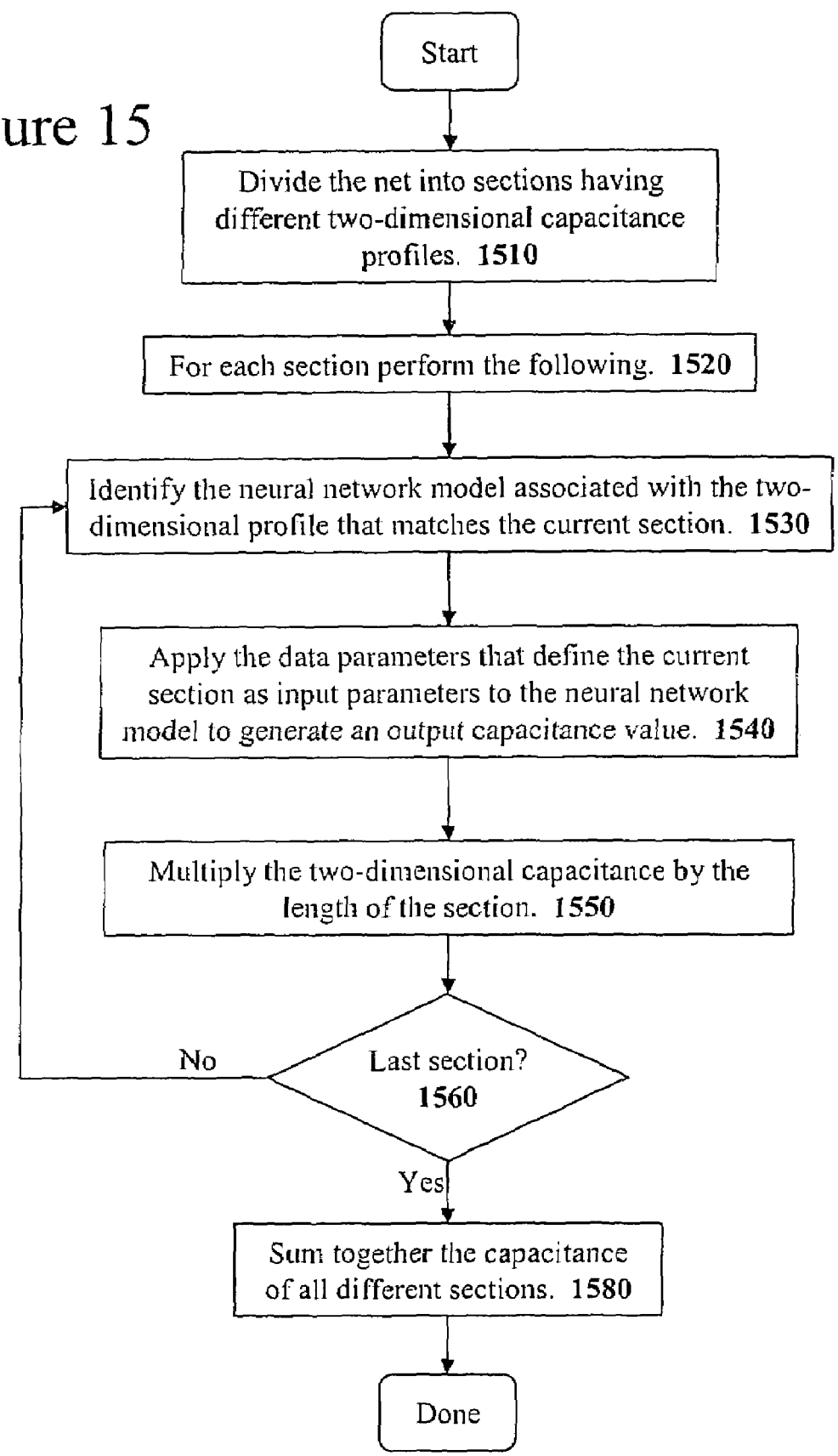
FIG. 15 illustrates a flow diagram describing how Bayesian models may be used to extract the capacitance of a net in an integrated circuit layout.

FIG. 15 illustrates a flow diagram that describes how a Bayesian model is used to extract the capacitance of a net. As with prior systems, the net is first divided into different interconnect wiring sections having different two-dimensional capacitance profiles. Then, at step 1520, the iterative process of analyzing each different section begins.

At the first step in the iterative process, step 1530, the system identifies the neural network model associated with the two-dimensional profile that matches the current wiring section. Then at step 1540, the data parameters that define the current two-dimensional profile are provided to the selected neural network model to obtain a predicted capacitance per unit length value from the neural network model. Then, at step 1550, the extraction system multiplies the predicted two-dimensional capacitance per unit length value by the length of the current interconnect wiring section to determine the capacitance of the interconnect wiring section. This calculated capacitance is stored for later use.

At step 1560, the system determines if this is the last interconnect wiring section of the net. If this is not the last interconnect wiring section, then the system returns to step 1530 to analyze the next interconnect wiring section.

Referring again to step 1560, if this is the final interconnect wiring section then the system proceeds to step 1580. At step 1580, the system sums together all the capacitance values for the different interconnect wiring sections to determine the overall capacitance of the net.

Resistance Extraction

It is also desirable to extract the resistance of interconnect lines. Resistance on interconnect lines can cause delays and lower output voltages. By extracting interconnect line resistance values, the circuits may be simulated to ensure that the circuits perform as desired.

Calculating the resistance of an interconnect line is generally a less complicated task than calculating the capacitance of an interconnect line. For example, the calculation of the resistance for a single straight interconnect line is simply the resistance per unit length multiplied by the length of the interconnect line. The resistance per unit length can generally be calculated when the cross sectional area of interconnect line and the material composition of the interconnect line are known. The cross sectional area for a typical rectangular interconnect line is simply the width of the interconnect line multiplied by the height of the interconnect line (the height of the metal layer). Since the height of the metal layer and the material composition of the interconnect line are fixed for a particular process, the only parameters required when modeling a straight interconnect line are the width of the interconnect line and the length of the interconnect line. For such a simple model, a neural network is generally not necessary and not used.

However, most interconnect wires are not simply straight lines. The interconnect wires will turn corners, switch layers, and fork out into more than one destination. All of these complex factors can effect the resistance of the interconnect line. However, the machine-learning techniques of the present invention can be used account for such complex factors after training upon a sufficient number of training cases.

To perform resistance extraction using the machine-learning techniques of the present invention, the same overall procedure is used as described in the previous sections. Specifically, the resistance extraction problem is first decomposed into smaller simpler resistance extraction problems that can be used to represent any interconnect wire. Each smaller resistance extraction problem is then analyzed to identify a set of parameters that fully define the smaller resistance extraction problem. Then, resistance extraction neural network models are built for all of the smaller resistance extraction problems by creating training data sets and training neural network models with Bayesian inference machine-learning.

To apply the resistance extraction neural network models, the extraction software would first decompose a given interconnect wire into the various smaller resistance extraction problems. Then, for each smaller resistance extraction problem, the parameters that define that smaller resistance extraction problem are supplied to the neural network trained for such a resistance extraction problem.

FIGS. 16, 17, 18*a*, 19*a*, and a straight line (not shown) describe different shapes that an interconnect wire may be decomposed into. As previously set forth, the straight line is a trivial case.

Figure 16:
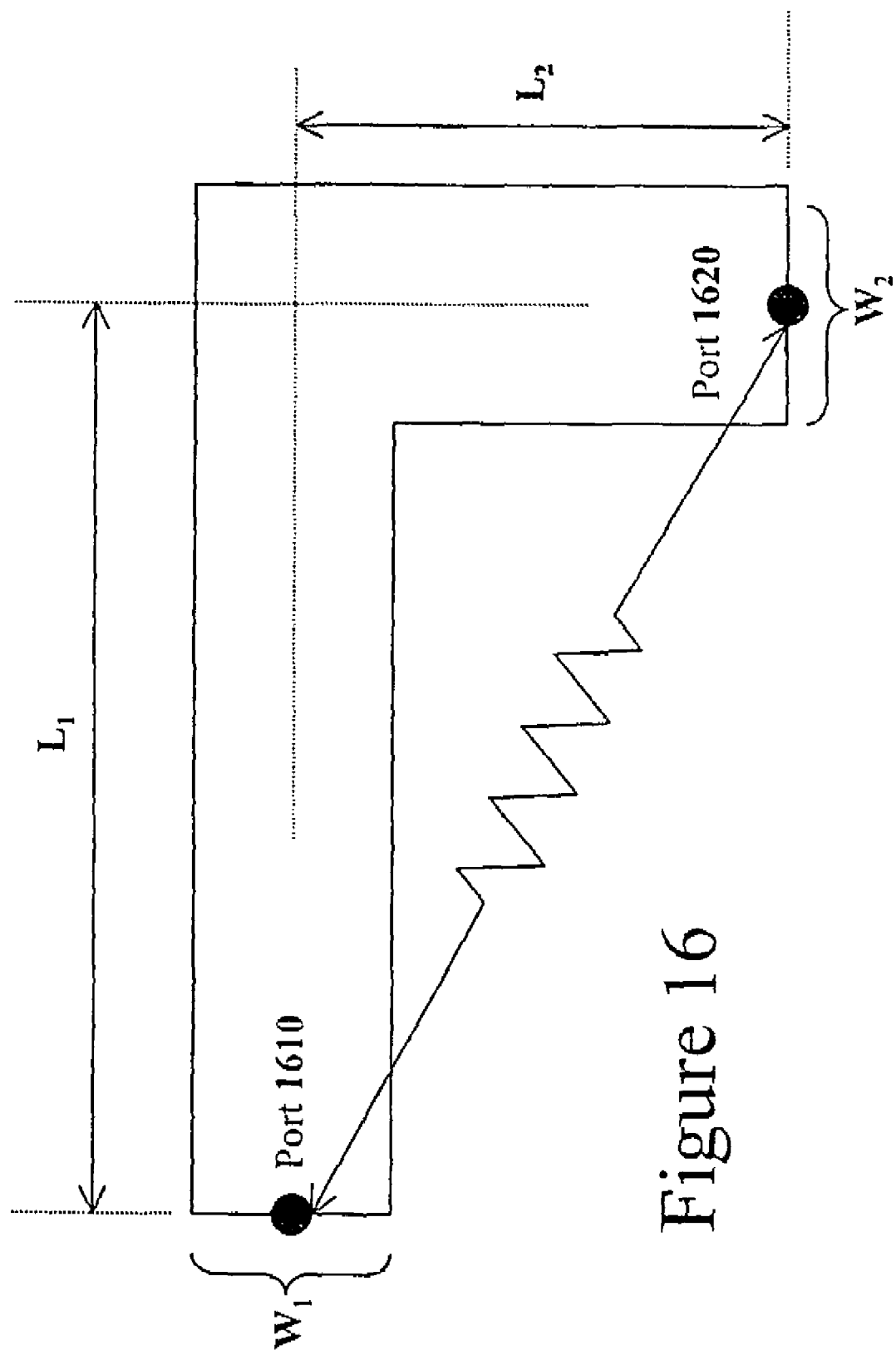
FIG. 16 illustrates a two-port corner shape for a small resistance extraction problem.

FIG. 16 illustrates a simple corner. The smaller extraction problem of FIG. 16 can be used to determine the resistance between port 1610 and port 1620 for corners. The input parameters are interconnect line widths ($W_1$ and $W_2$) and interconnect line lengths ($L_1$ and $L_2$) and outputs a single resistance value.

Figure 17:
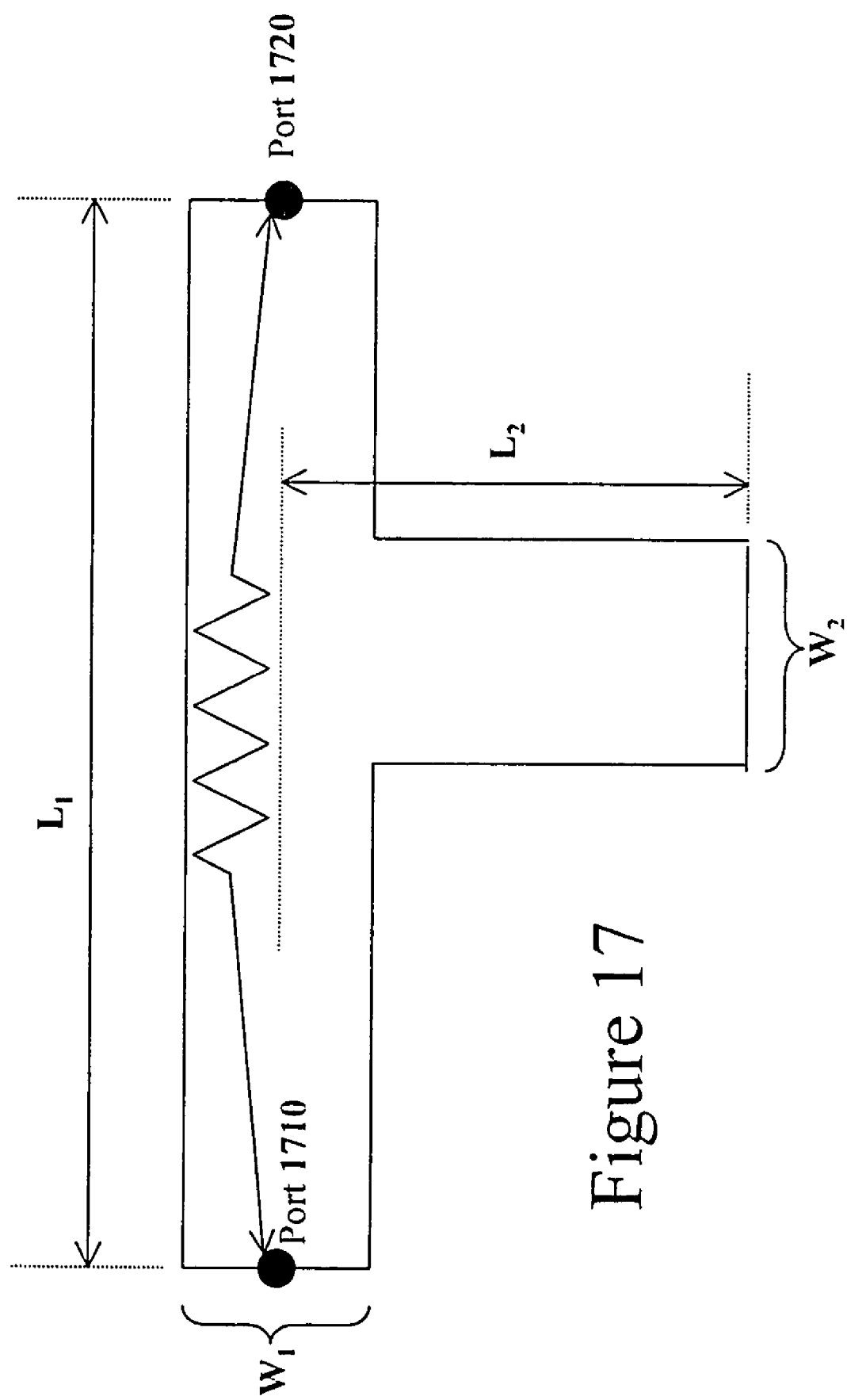
FIG. 17 illustrates a two-port "T" shape for a small resistance extraction problem.

FIG. 17 illustrates a two-port "T" shape. The smaller extraction problem of FIG. 17 can be used to determine the resistance between port 1710 and port 1720 for such two port "T" shapes. The input parameters are interconnect line widths ($W_1$ and $W_2$) and interconnect line lengths ($L_1$ and $L_2$) and outputs a single resistance value.

Figure 18A:
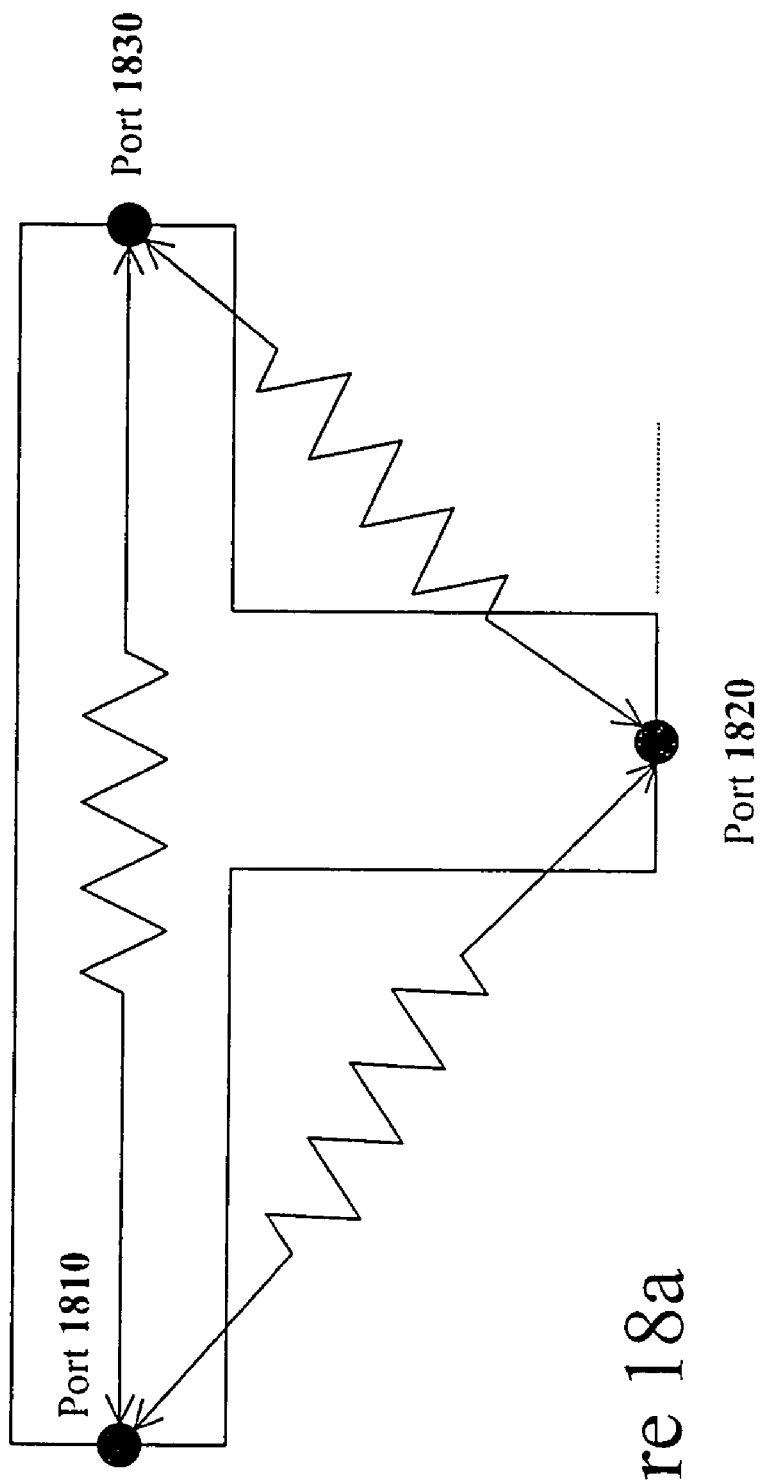
FIG. 18a illustrates a three-port "T" shape for a small resistance extraction problem.
Figure 18B:
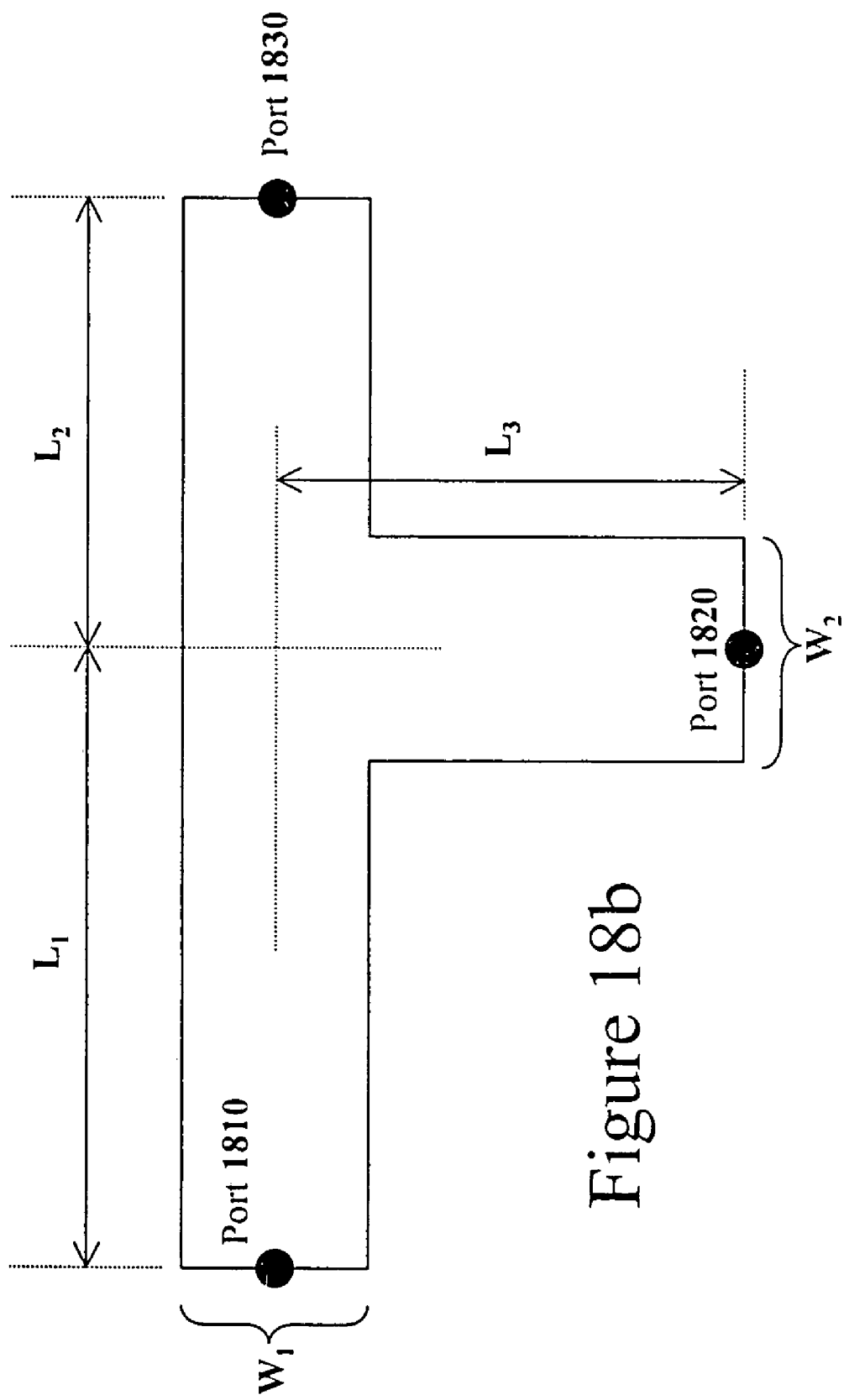
FIG. 18b illustrates the three-port "T" shape of FIG. 18a with the associated physical measurements needed for the resistance extraction problem.

FIGS. 18a and 18b illustrate a three-port "T" shape. The extraction problem of FIG. 18a can be used to determine the resistance between port 1810 and port 1820, port 1810 and port 1830, and port 1830 and port 1820 for such three port "T" shapes. The input parameters are interconnect line widths ($W_1$ and $W_2$) and interconnect line lengths ($L_1$, $L_2$ and $L_3$) and outputs three different resistance values as illustrated in FIG. 18b.

Figure 19A:
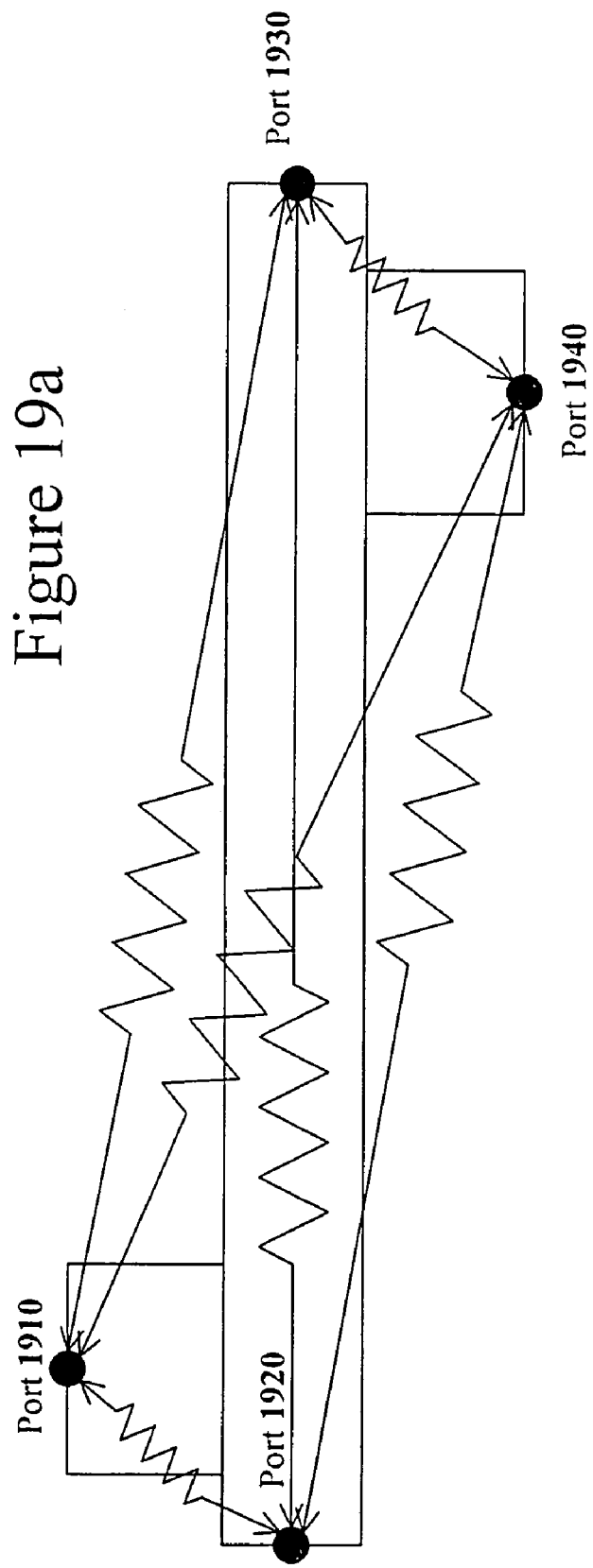
FIG. 19a and illustrates a four-port shape for a small resistance extraction problem. The four-port extraction
Figure 19B:
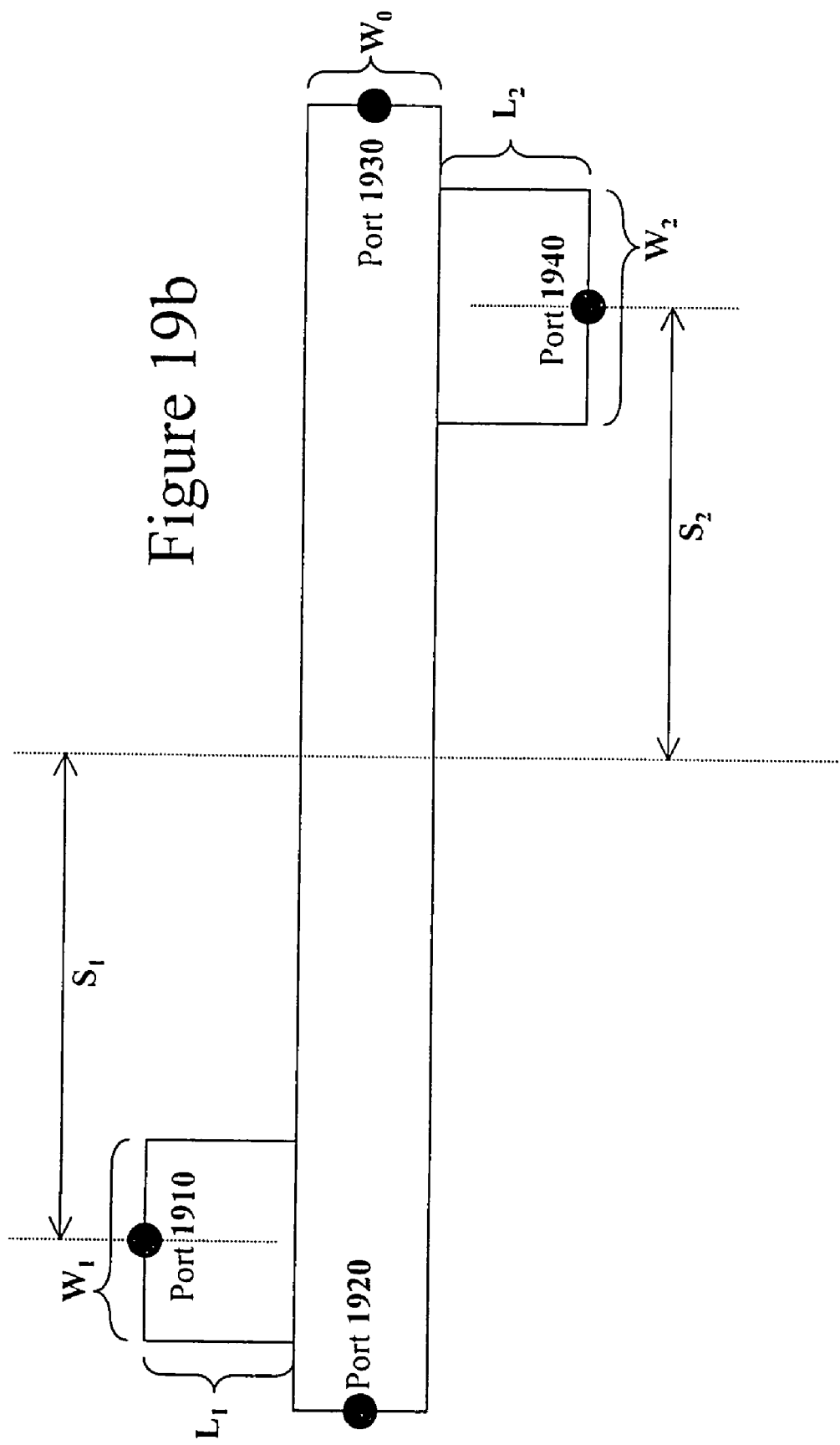
FIG. 19b illustrates the four-port shape of FIG. 19a with the associated physical measurements needed for the resistance extraction problem.

FIGS. 19a and 19b illustrate a four-port shape. The four-port extraction problem of FIG. 19a can be used to determine the six different resistance values between the various different ports 1910, 1920, 1930, and 1940 as illustrated in FIG. 19a. The input parameters for the four-port shape extraction problem of FIG. 19b are interconnect line widths ($W_0$, $W_1$ and $W_2$), interconnect line lengths ($L_1$ and $L_2$), and line spacings ($S_1$ and $S_2$). The four-port shape extraction neural network outputs six different resistance values for the resistances illustrated in FIG. 19b.

Delay Calculation

The machine learning system of the present invention can also be used to make circuit delay determinations. All electrical circuits have a delay time that is specified as the time required from when an input is applied until a stable output value is generated by the circuit.

To calculate the delay time for a circuit, a complex circuit simulator known as a SPICE is used. The SPICE software receives a description of the circuit and then analyzes the circuit's output response to different input conditions. For example, an input node may receive an input step voltage of 2.7 volts. In response to the voltage applied to the input node, the SPICE software may determine that the circuit will take 25 picoseconds to generate a stable output.

The system of the present invention may be used to learn from such SPICE simulations in order to make predictions on the circuit behavior. For example, referring the example of the previous paragraph, a SPICE simulation may be run on a particular circuit providing a number of different input voltage situations and then determining the amount of time needed for the circuit to generate a stable output value. Then, the input conditions and output time values from the SPICE simulation may be used to train a neural network. After the training, the trained neural network may be used to make estimations of the amount of time needed to generate a stable output for various other input conditions not simulated with the SPICE software.

Training Point Selection

Since machine-learning systems are completely dependent upon the training data, great care must be taken to select very good training data points. Several different methods of selecting input data have been analyzed.

Boundary Value Input Data

A first method of selecting the input data points is to select a wide variety of boundary conditions. For example, one may wish to create training data containing every permutation of the smallest, mean, and largest input parameter values.

FIG. 10 illustrates a semiconductor interconnect line 1010 surrounded by four other parallel interconnect lines, two on the same layer and two on the above layer. To determine the parasitic capacitance of interconnect line 1010, the relevant physical characteristic information are the size of the five interconnect lines and the distance between analyzed interconnect line 1010 and the other interconnect lines.

Since the height of the interconnect lines is constant as set by the semiconductor process, the height of the interconnect lines can be ignored. Thus, one embodiment only considers the width of the five interconnect lines ($W_0$, $W_1$, $W_2$, $W_3$, and $W_4$) to specify the size of the interconnect lines. Similarly, the vertical distance separating the semiconductor layers is constant and dictated by the semiconductor process Thus, the vertical distance between the analyzed interconnect line 1010 and the other interconnect lines may be ignored. One embodiment of the present invention therefore only considers the horizontal distance between the analyzed interconnect line 1010 and the other interconnect lines ($S_1$, $S_2$, $S_3$, and $S_4$). Thus, the capacitance problem of FIG. 10 can be completely parameterized with nine physical measurements: $W_0$, $W_1$, $W_2$, $W_3$, $W_4$, $S_1$, $S_2$, $S_3$, and $S_4$.

To test the boundary conditions and the mean conditions, every permutation should be used as an input training point. Specifically, all combinations of smallest, mean, and largest input parameter values for all nine measurements should be tested. Thus, there will be $3*3*3*3*3*3*3*3*3=3^9=19,683$ training points. 19,683 is an unreasonably large number of training points to solve with field solvers and train the Bayesian inference system with.

Monte Carlo Training Point Selection

Another way to select training points is to randomly select the training points. By selecting a large number of random training points, one would hope to obtain a good representation of the overall function.

Various different Monte Carlo methods may be employed. In one embodiment, each scalar of a input training vector training is selected completely at random from the space of valid values. Such an embodiment is not very effective since large areas of the input space may be "valid" but rarely ever encountered in reality.

Targeted Monte Carlo Training Point Selection

A better Monte Carlo training point selection method is randomly select training points using a probability density that favors the more typical points. In this manner, the model will be trained using data that it will be likely to encounter in real world extraction problems.

For example, when attempting to extract the capacitance of an interconnect line, the width (W) of that interconnect line is a relevant statistic. Obviously, the width of the interconnect line will be greater than zero. However, due to process technology requirements, the interconnect line must also be wider than a minimum interconnect line width defined for that semiconductor manufacturing process. To conserve silicon die area, most interconnect lines will not be much larger than the defined minimum interconnect line width. Thus, most interconnect lines will be larger than but close to the defined minimum interconnect line width. To randomly select widths for a such a input training point, a system could use a gamma probability function.

The foregoing has described methods arrangement for extracting capacitance in integrated circuit designs using Bayesian capacitance models. It is contemplated that changes and modifications may be made by one of ordinary skill in the art, to the materials and arrangements of elements of the present invention without departing from the scope of the invention.

We claim:

1. A method of constructing a model for estimating electrical characteristics for an extraction sub problem, said method comprising:
   identifying a set of physical measurements that define said extraction sub problem;
   selecting a set of training cases for said specific extraction sub problem, each of said training cases including an associated set of said physical measurements;
   solving said specific extraction sub problem for each of said training cases using said associated set of physical measurements as an input to an accurate physics based model to generate an associated output; and
   training a neural network using said associated set of physical measurements and associated outputs as training data.

2. The method as claimed in claim 1 wherein said electrical characteristic comprises capacitance.

3. The method as claimed in claim 1 wherein said electrical characteristic comprises resistance.

4. The method as claimed in claim 1 wherein said extraction sub problem comprises a section of interconnect wire and nearby interconnect wiring within a define halo.

5. The method as claimed in claim 1 wherein said extraction sub problem comprises a section of interconnect wiring.

6. The method as claimed in claim 1 wherein one of said set of physical parameters comprises a spacing between a pair of interconnect lines.

7. The method as claimed in claim 1 wherein one of said set of physical parameters comprises a wire width.

8. The method as claimed in claim 1 wherein one of said set of physical parameters comprises a wire length.

9. The method as claimed in claim 1 wherein selecting a set of training cases comprises randomly generating input parameters with a gamma probability distribution.

10. The method as claimed in claim 1 wherein said electrical characteristic comprises delay.

* * * * *